(12) United States Patent
Yudasaka et al.

(10) Patent No.: US 7,265,021 B2
(45) Date of Patent: Sep. 4, 2007

(54) ALIGNMENT METHOD, METHOD FOR MANUFACTURING A SEMICONDUCTOR DEVICE, SUBSTRATE FOR A SEMICONDUCTOR DEVICE, ELECTRONIC EQUIPMENT

(75) Inventors: Ichio Yudasaka, Chino (JP); Hideki Tanaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 294 days.

(21) Appl. No.: 11/016,709

(22) Filed: Dec. 21, 2004

(65) Prior Publication Data
US 2005/0161836 A1 Jul. 28, 2005

(30) Foreign Application Priority Data

| Jan. 21, 2004 | (JP) | 2004-013025 |
| Feb. 23, 2004 | (JP) | 2004-046153 |
| Sep. 17, 2004 | (JP) | 2004-272018 |

(51) Int. Cl.
*H01L 21/76* (2006.01)

(52) U.S. Cl. .............. 438/401; 257/E21.029; 257/E21.703; 257/797

(58) Field of Classification Search ........... 438/782, 438/401; 257/E21.029, E21.413, E21.703, 257/E23.179, 797
See application file for complete search history.

(56) References Cited

U.S. PATENT DOCUMENTS

| 4,824,254 A | 4/1989 | Ohtsuka et al. |
| 4,992,394 A | 2/1991 | Kostelak, Jr. et al. |
| 5,696,003 A | 12/1997 | Makita et al. |
| 5,733,801 A | 3/1998 | Gojohbori |
| 6,136,481 A * | 10/2000 | Aoki .................. 430/7 |
| 6,249,036 B1 | 6/2001 | Kajita et al. |
| 6,326,278 B1 | 12/2001 | Komuro |
| 6,566,157 B2 | 5/2003 | Ohtaka |
| 6,864,133 B2 | 3/2005 | Aoki et al. |
| 2001/0049177 A1 | 12/2001 | Nagai |

FOREIGN PATENT DOCUMENTS

| JP | A-59-224123 | 12/1984 |
| JP | A-63-144545 | 6/1988 |
| JP | A-01-241117 | 9/1989 |
| JP | A-01-241118 | 9/1989 |
| JP | A-02-134808 | 5/1990 |
| JP | A-03-66116 | 3/1991 |
| JP | A 3-138920 | 6/1991 |
| JP | A 4-63415 | 2/1992 |
| JP | A-07-176463 | 7/1995 |
| JP | A-07-273338 | 10/1995 |
| JP | A-07-297112 | 11/1995 |
| JP | A-09-223656 | 8/1997 |

(Continued)

*Primary Examiner*—Caridad Everhart
(74) *Attorney, Agent, or Firm*—Oliff & Berridge, PLC

(57) ABSTRACT

Aspects of the invention can provide an alignment method that is preferably applicable when manufacturing equipments by liquid-phase processing. The alignment method in a device manufacturing process can include forming of a functional film on a substrate by liquid-phase processing, forming an alignment mark on the substrate on which the functional film is formed so as to make a pattern of the alignment mark appear on a film that is formed after forming the functional film, and aligning the film that is formed after forming the functional film by using the alignment mark.

17 Claims, 10 Drawing Sheets

FOREIGN PATENT DOCUMENTS

| | | |
|---|---|---|
| JP | A-11-233411 | 8/1999 |
| JP | A-2000-133695 | 5/2000 |
| JP | WO 00/59040 | 5/2000 |
| JP | A-2001-351837 | 12/2001 |
| JP | A-2002-075846 | 3/2002 |
| JP | A-2002-507840 | 3/2002 |
| JP | A-2003-209041 | 7/2003 |
| JP | A-2003-318191 | 11/2003 |
| JP | A-2003-318193 | 11/2003 |
| KR | 2001-0072861 | 7/2001 |
| TW | 466678 | 1/2001 |
| TW | 485592 | 5/2002 |
| WO | WO 00/79336 A1 | 12/2000 |

\* cited by examiner

ALIGNMENT METHOD, METHOD FOR MANUFACTURING A SEMICONDUCTOR DEVICE, SUBSTRATE FOR A SEMICONDUCTOR DEVICE, ELECTRONIC EQUIPMENT

BACKGROUND

1. Technical Field of Invention

Aspects of the invention can relate to an alignment method, a method for manufacturing a semiconductor device, a substrate for a semiconductor device, and electronic equipment.

2. Description of Related Art

Related art methods for manufacturing a thin-film electronic device have been developed based on vacuum processing employing evaporation. While the vacuum processing can provide extremely high processing accuracy, it consumes a significant amount of energy and materials ineffectively. Therefore, low energy consuming, liquid-phase processing (using a liquid-phase method) has come under review as a substitution for the vacuum processing. See, for example, Domestic Republication of PCT International Publication No. WO 00/59040.

The liquid-phase processing provides the following advantages over the related art vacuum processing that involves evaporation. First, no vacuum equipment is required, which makes it possible to reduce the size of a manufacturing equipment. Second, the surface of films are planarized, which prevents the breaking of wires provided on the surface. Also, a high-voltage-resistant transistor can be manufactured by using a planarized film as a gate insulating film.

SUMMARY OF THE INVENTION

As mentioned above, liquid-phase processing provides high-performance devices by planarizing the surface of their films. While manufacturing such devices, however, the planarization of surface of their films may cause a problem. Specifically, when forming a thin film by liquid-phase processing (e.g., spin coating), a concave-convex pattern positioned under the thin film is planarized by the thin film. Therefore, if a film that does not transmits light is formed on the thin film for patterning, it can be difficult to make an alignment based on the pattern on the surface of the film like in photo processing. For example, if the gate insulating film or interlayer insulating film of a thin-film transistor is formed by liquid-phase processing, the surface of a metal film formed on the insulating film has no concave-convex pattern, and thereby it cannot be correctly aligned with an underlying semiconductor film.

In consideration of this problem, the invention can provide an alignment method that is preferably applicable when manufacturing equipments by liquid-phase processing. The alignment method can include the following steps in a device manufacturing process including forming of a functional film on a substrate by liquid-phase processing, forming an alignment mark on the substrate on which the functional film is formed so as to make a pattern of the alignment mark appear on a film that is formed after forming the functional film, and aligning the film that is formed after forming the functional film by using the alignment mark. Using the alignment mark can provide accurate patterning of a film that is formed after forming the functional film.

A functional film can be a collective term referring to films with predetermined functions. Examples of such functions may include electric and electronic functions (e.g. conductive, insulating, piezoelectric, pyroelectric, and dielectric properties), optical functions (e.g. photoselective absorption, reflectivity, polarization, photoselective transmission, nonlinear optical properties, luminescence such as fluorescence and phosphorescence, photochromic properties), magnetic functions (e.g. hard magnetism, soft magnetism, nonmagnetism, permeability), chemical functions (e.g. absorption, desorption, catalysis, water absorption, ion conductivity, oxidation-reduction properties, electrochemical characteristics, electrochromic properties), mechanical functions (e.g. abrasion resistance), thermal functions (e.g. thermal conductivity, thermal insulation, infrared radiation), and biological functions (e.g. biocompatibility, antithrombogenicity).

Liquid phase processing can refer to methods for depositing a liquid material on a substrate. Examples of such methods may include spin coating, slit coating, dip coating, spray coating, printing, and droplet delivery methods.

According to an aspect of the invention, the step of forming an alignment mark may include the step of forming an alignment mark that is high enough to remain above the level of planarization by the functional film between the substrate and the functional film. This method is to form a high alignment mark that is high enough to remain above the level of planarization by the functional film on the substrate before forming the functional film. More specifically, this may be achieved by the following methods. The step of forming an alignment mark can further include the step of forming a high alignment mark on the substrate in advance. The step of forming an alignment mark can further include the step of forming a second alignment mark that is high enough to remain above the level of planarization by the functional film by adding an alignment mark forming material on a first alignment mark provided in advance on the substrate.

In the method, the step of forming a second alignment mark may include the step of selectively dropping a liquid material containing the alignment mark forming material in a region for forming the first alignment mark by a droplet delivery method.

According to the invention, the step of forming an alignment mark may also include the step of forming the functional film that is transmissive on the substrate having a first alignment mark, and then forming a second alignment mark on the functional film by using the first alignment mark that is visible through the transmissive functional film. This method is to use an alignment mark provided on the substrate in advance (first alignment mark) for making another alignment mark (second alignment mark) after forming the functional film. In this case, the relative position of the second alignment mark may be determined by the position of the first alignment mark. This way, non-alignment between a film formed before forming the functional film and a film formed after forming the functional film can be prevented. Here, the second alignment mark is not necessarily placed at the same position as that of the first alignment mark. However, if the first alignment mark and the second alignment mark are placed in almost the same position on a plane surface, a film formed after forming the functional film can be aligned more accurately.

Another alignment method of the invention can include the following step in a device manufacturing process including forming of a functional film on a substrate having an alignment mark by liquid-phase processing, forming the functional film in a region other than a region for forming the alignment mark, and aligning a film that is formed after forming the functional film by using the alignment mark. According to this method, the functional film is not provided in a region for forming the alignment mark. Therefore, the concave-convex pattern of the alignment mark is not planarized by the functional film. As a result, this method also can provide accurate patterning of a film that is formed after forming the functional film.

More specifically, the functional film may be formed by the following methods. First, the step of forming the functional film can include the steps of providing a region for forming the alignment mark with liquid repellency, and depositing a liquid material containing a material for forming the functional film in a region including the liquid repellent region on the substrate. Second, the step of forming the functional film can include the steps of forming the functional film in a region including a region for forming the alignment mark on the substrate, and selectively removing the functional film that is positioned on the alignment mark. Third, the step of forming a functional film can include the step of selectively dropping a liquid material containing a material for forming the functional film in a region other than a region for forming the alignment mark by a droplet delivery method.

In the above method of forming the functional film in a region including the alignment mark on the substrate, the functional film may be patterned by the following methods. the step of forming the functional film can include the steps of forming the functional film that can be transmissive in a region including a region for forming the alignment mark on the substrate, and selectively removing only the functional film that is positioned on the alignment mark by using the alignment mark that is visible through the transmissive functional film. The step of removing the functional film can be the step of selectively removing the functional film in a certain range in which the alignment mark is considered to be positioned.

According to the method of forming the functional film that is transmissive, the position of the alignment mark is detected, and then only the functional film that is placed in this position is removed accurately. According to the method of removing the functional film, when the position of the alignment mark is known to a certain extent, the functional film that is placed in and near a position in which the alignment mark is considered to be provided is roughly removed. The method of removing the functional film does not necessarily require a transmissive film as the functional film, and an opaque material can also be used.

A method for manufacturing a semiconductor device according to an aspect of the invention can include any of the above-mentioned alignment methods in order to manufacture a semiconductor device. This method can provide high performance semiconductor devices. More specifically, the method for manufacturing a semiconductor device according to the invention can include the step of forming of an insulating film on a substrate by liquid-phase processing, and can include the steps of forming a semiconductor film on the substrate and patterning the semiconductor film so as to form a first semiconductor film serving as an active layer of a semiconductor device and to form a second semiconductor film for alignment, forming an alignment mark at a predetermined position in alignment with the second semiconductor film so as to make a pattern of the alignment mark appear on a film that is formed after forming the insulating film; and patterning a film that is formed after forming the insulating film by using the alignment mark. Using the alignment mark can provide accurate patterning of a film that is formed after forming the insulating film.

In this specification, alignment can refer to the state in which positional relationship between objects is under control. Forming the alignment mark in alignment with the second semiconductor film means that the two are formed under a certain condition, for example, the two are overlapped or spaced at a predetermined ratio, or in contact with each other. Also in this specification, an active layer can refer to layers that make up a semiconductor device and electrically function, such as a channel part of a transistor. Patterned layers used only as alignment marks are not included in this. Liquid-phase processing can be collective term referring to methods for providing a thin film with a liquid material on a substrate. Examples of such methods may include spin coating, slit coating, dip coating, spray coating, printing, and droplet delivery methods.

According to the exemplary method for manufacturing a semiconductor device of the invention, the step of forming an alignment mark may include the step of forming an alignment mark that is high enough to remain above the level of planarization by the insulating film between the substrate and the insulating film. This method is to form a high alignment, mark that is high enough to remain above the level of planarization by the insulating film on the substrate before forming the insulating film. More specifically, the step of forming an alignment mark may include the step of forming an alignment mark that is high enough to remain above the level of planarization by the insulating film at the predetermined position. In this case, the step of forming an alignment mark may include the step of forming an alignment mark that is high enough to remain above the level of planarization by the insulating film at the predetermined position.

Another method for manufacturing a semiconductor device according to the invention can include the step of forming of an insulating film on a substrate by liquid-phase processing, and can include the step of forming a semiconductor film on the substrate and patterning the semiconductor film so as to form a first semiconductor film serving as an active layer of a semiconductor device and to form a second semiconductor film for alignment, forming the insulating film at a position other than a predetermined position in alignment with the second semiconductor film, and patterning a film that is formed after forming the insulating film by using a concave-convex pattern, as an alignment mark, created on a surface of the film that is formed after forming the insulating film by an insulating-film non-forming region.

This exemplary method is to provide the surface of a film that is formed after forming the insulating film with a concave-convex pattern reflecting a concave-convex pattern (an opening, for example) created on the insulating film, and pattern the film that is formed after forming the insulating film by using the concave-convex pattern, as an alignment mark, provided on the film. As a result, this method also can provide accurate patterning of a film that is formed after forming the insulating film.

According to the method for manufacturing a semiconductor device of an aspect of the invention, the insulating-film non-forming region may be provided in a planar area of the second semiconductor film. In this case, the pattern of the second semiconductor film appears on the surface of a film that is formed after forming the insulating film, and thereby providing higher alignment accuracy than in a case in which the non-forming region is provided in a different position.

According to the exemplary method for manufacturing a semiconductor device of the invention, the step of forming the insulating film can include the steps of forming a mask member at the predetermined position, forming the insulating film on a whole surface of the substrate except for the mask member, and removing the mask member. This method is to provide the insulating film with a non-forming region (opening) at the predetermined position by removing the mask member, provided on the substrate before forming the insulating film, after forming the insulating film. This method causes less damage on the substrate than in a case in which the opening is formed on the insulating film by etching. Even if the insulating film is made of an opaque material, the opening can be formed accurately at the predetermined position.

More specifically, here the mask member may be formed by the following methods.

First, the step of forming a mask member includes the steps of applying a light-sensitive material on a whole surface of the substrate, and performing an exposure and development process so as to form a mask member made of the light-sensitive material at the predetermined position. Second, the step of forming a mask member includes the step of forming the mask member at the predetermined position by liquid-phase processing.

Another exemplary method for manufacturing a semiconductor device according to the invention can include the step of forming of a functional film on a substrate by liquid-phase processing, forming a mask member on the substrate, forming the functional film on a whole surface of the substrate except for the mask member by liquid-phase processing, and patterning the functional film by using a functional-film non-forming region, as an alignment mark, made by the mask member.

This exemplary method is to make a functional-film non-forming region (opening) by using the mask member formed on the substrate in advance, and pattern the functional film with high accuracy of alignment with an underlying layer (the semiconductor film, for example) by using the non-forming region as an alignment mark. This exemplary method can also surely align the functional film with an underlying layer with high accuracy, even if the functional film is made of an opaque film.

A substrate according to the invention can be a substrate on which a plurality of wiring layers are stacked with a functional film therebetween. The functional film is formed by liquid-phase processing. The substrate is provided with an alignment mark in a way that the pattern of the alignment mark appears on a film that is formed after forming the functional film on the substrate. Using the alignment mark can provide patterning of a wiring layer that is formed after forming the functional film with high accuracy of alignment with a wiring layer that is formed before forming the functional film.

Electronic equipment of the invention can also include a semiconductor device manufactured by any of the above-mentioned methods for manufacturing a semiconductor device. This method can provide high performance electronic equipment.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENT

Exemplary embodiments of the invention will now be described with reference to the accompanying drawings. In the accompanying drawings, the film thickness and the scale of each element is adequately changed, so that they are visible.

Figure 1:
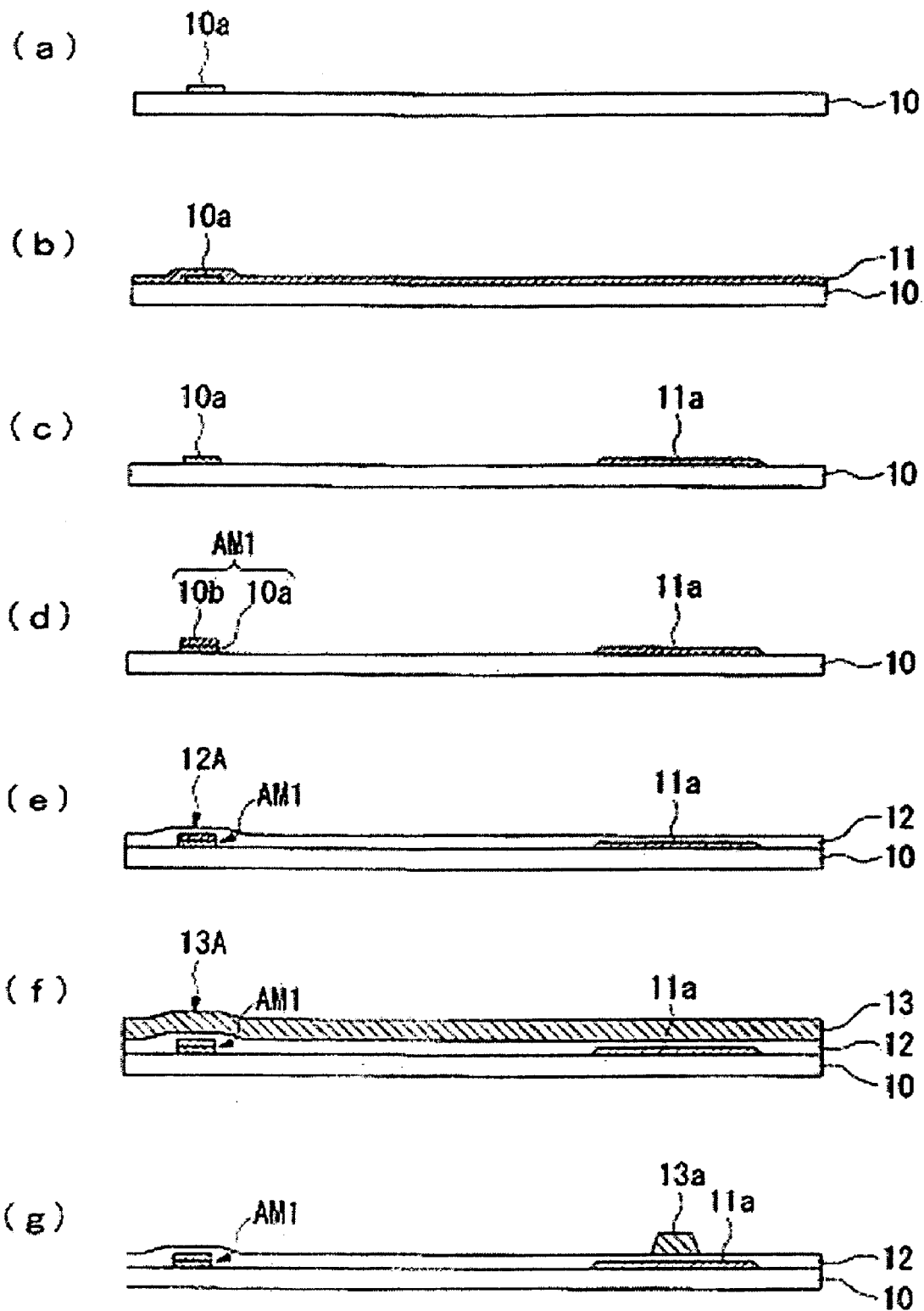
FIG. 1 is a process drawing illustrating a method for manufacturing a semiconductor device of a first exemplary embodiment of the invention.
Figure 2:
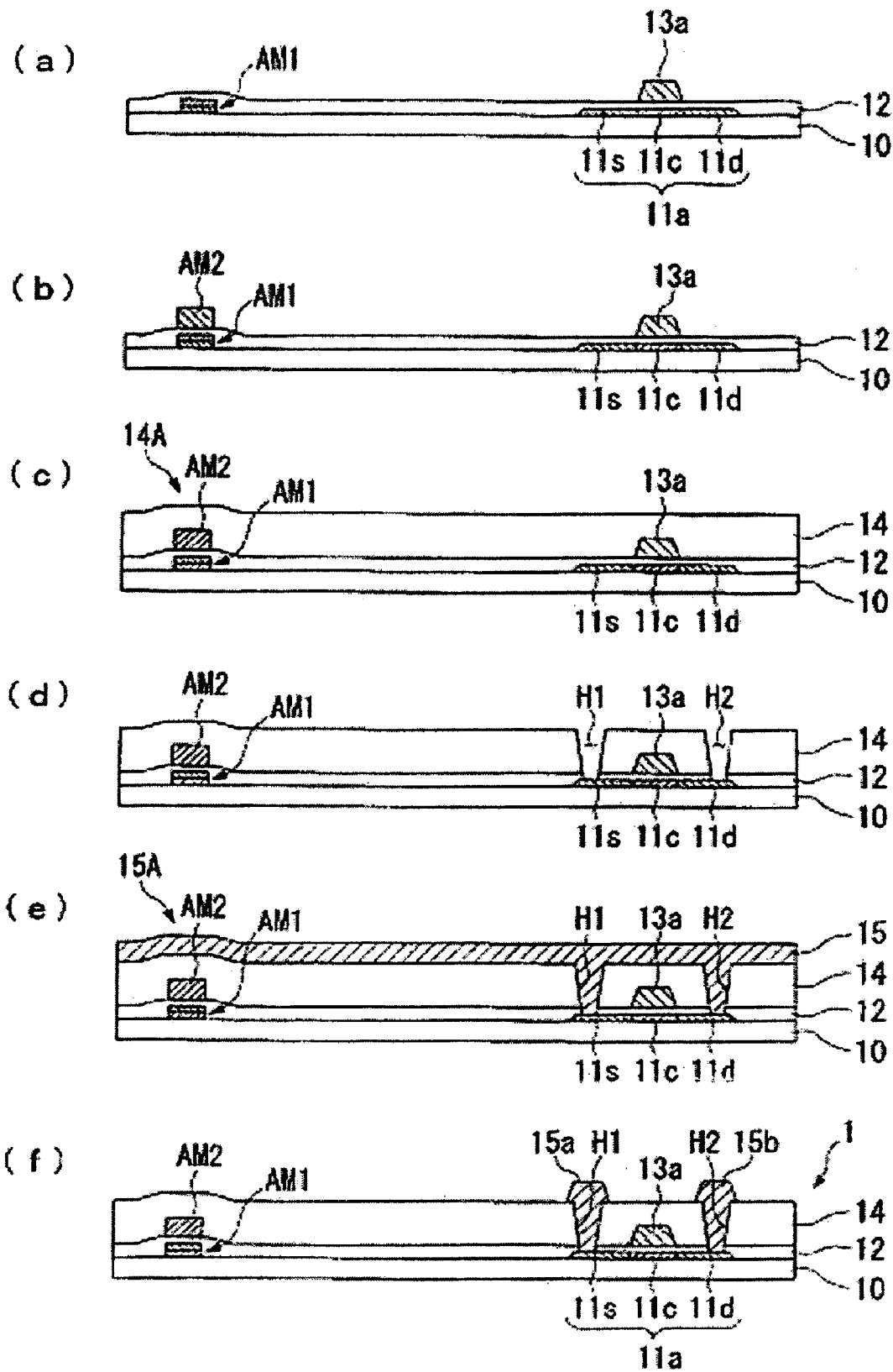
FIG. 2 is a process drawing illustrating steps following the steps shown in FIG. 1.

Referring to FIGS. 1 and 2, a first exemplary embodiment of the invention will now be described. FIGS. 1 and 2 are process drawings illustrating a method for manufacturing a thin-film transistor (TFT) which is an example of semiconductor devices according to the embodiment. The drawings schematically show a transistor forming region and an alignment mark forming region in a magnified form.

A substrate 10 having an alignment mark 10$a$ as shown in FIG. 1$a$ is provided as a substrate for manufacturing a semiconductor device (substrate for a semiconductor device). Examples of the substrate 10 may include both insulating substrates made of quartz, glass, heat-resistant plastic, etc., and conductive substrates made of semiconductor materials (e.g. silicon wafers), stainless materials, etc. On the surface of the substrate 10, an underlying protective film made of an insulating material, such as a silicon oxide film, silicon nitride film, or silicon oxide nitride film, can be formed if necessary, so that sodium and other moving ions contained in the substrate do not get mixed in a semiconductor film that will be described below.

As shown in FIG. 1$b$, a semiconductor film 11 is deposited on the substrate 10. While the semiconductor film 11 is an amorphous silicon film in this example, the semiconductor film 11 may be made of other semiconductor materials such as germanium. Otherwise, semiconductor films of a complex of Group IV elements, e.g. silicon and germanium, silicon and carbide, germanium and carbide; semiconductor films of a complex compound of Group III and Group V elements, e.g. gallium and arsenic, indium and antimony; and semiconductor films of a complex compound of Group II and Group VI elements, e.g. cadmium and selenium can be used. In addition, semiconductor films of a further complex compound, such as silicon, germanium, gallium, and arsenic; N-type semiconductor films that are such semiconductor films in which donor elements of, for example phosphorous (P), arsenic (As), or antimony (Sb) are doped; and P-type semiconductor films that are such semiconductor films in which acceptor elements of, for example, boron, aluminum (Al), gallium (Ga), or indium (In), are doped can also be used.

The semiconductor film 11 can be formed by chemical vapor deposition (CVD), such as atmospheric pressure CVD (APCVD), low pressure CVD (LPCVD), and plasma enhanced CVD (PECVD), and physical vapor deposition (PVD), such as sputtering and evaporation.

The semiconductor film 11, which has been deposited, is then crystallized. Here, crystallization means providing an amorphous semiconductor film with thermal energy so as to transform it into a polycrystalline or single crystal silicon film, and also means providing a microcrystalline or polycrystalline semiconductor film with thermal energy so as to recrystallize it by improving the quality of the crystalline film or by melting and solidifying it. In this specification, crystallization refers not only to the crystallization of amorphous substances, but also to the crystallization of polycrystalline and microcrystalline substances.

Examples of crystallization processing of the semiconductor film 11 may include, but not be limited to, laser irradiation, rapid heating (e.g. lamp annealing, thermal annealing), and solid-phase growth. Laser annealing is employed in this example to crystallize the semiconductor film 11, which is amorphous, so as to transform it into a polycrystalline semiconductor film. Here, an excimer laser, argon ion laser, the second and third harmonic of an yttrium-aluminum-garnet (YAG) laser, etc. with a wavelength within or around the range of UV rays are preferably used as laser light. For example, a line beam of an excimer laser whose longer length is 400 mm with an output strength of 400 $mJ/cm^2$ can be used. It is desirable to scan a line beam with the parts corresponding to 90% of the peak value of its laser strength in its shorter length direction overlapped in each region.

Then an isolation process can be performed in order to define a TFT region. While etching is adopted for this isolation process in this example, local oxidation of silicon (LOCOS), field shield, shallow trench isolation (STI), and other methods can also be used as an isolation technique. This isolation process forms a polycrystalline semiconductor film 11a having a predetermined shape as shown in FIG. 1C on the substrate 10.

As shown in FIG. 1d, an alignment mark material 10b is deposited onto the existing alignment mark (first alignment mark) 10a, so as to form a thick-film alignment mark (second alignment mark) AM1. Resist or other insulating materials can be used here as the alignment mark material 10b. Specifically, in order to deposit a resist onto the first alignment mark 10a, the film of a transmissive resist is formed on the whole surface of the substrate by spin coating, for example, and then the resist is patterned by using the alignment mark 10a, which is visible through this transmissive resist. In order to deposit an insulating material other than a resist onto the alignment mark 10a, the insulating material is dispersed in a solvent or dispersing medium such as xylene, and the solution (i.e., a liquid material containing an alignment mark material) is selectively dropped onto a region for forming the alignment mark 10a by a droplet delivery method (e.g., ink jetting). Then the drops are dried or burned. Instead of this method, other known patterning methods (e.g. etching) can be employed here.

By making the alignment mark 10a into the thick-film alignment mark AM1 in this step, it is possible to prevent the alignment mark AM1 from getting buried in a gate insulating film (functional film) when forming the gate insulating film by liquid-phase processing on the mark. Therefore, the pattern of the mark will appear on the films formed after forming the gate insulating film. In other words, if the gate insulating film is formed by applying a liquid material, the concave-convex pattern of a low alignment mark is planarized by the fluidity of the liquid material. If an opaque film of Ta, Cr, or the like that is a wiring material is formed on the gate insulating film in this state, the position and shape of the alignment mark lying underneath cannot be detected. Meanwhile, the method of this example makes an alignment pattern thick enough not to get buried in the gate insulating film, and thereby accurately patterning a wiring material in a subsequent step.

The height of the alignment mark AM1 can be set high enough to remain above the level of the planarization by the gate insulating film for the above reason, and is sufficiently about 1 μm, for example.

While FIG. 1d shows an example in which the alignment mark material 10b is placed directly upon the alignment mark 10a, it is also possible to deposit the alignment mark material 10b in a wider area than the alignment mark 10a so as to completely cover the alignment mark 10a according to the exemplary embodiment.

As shown in FIG. 1e, a gate insulating film (functional film) 12 of TFT is deposited on the whole surface of the substrate by liquid-phase processing so as to cover the semiconductor film 11a. First, an embrocation containing xylene mixed with polysilazane (a liquid material containing polysilazane) is spin-coated on the substrate. Then, prebaking is performed at 100 degrees Celsius for five minutes. Subsequently, heat treatment is performed at 350 degrees Celsius in a wet $O_2$ atmosphere for 260 minutes. Performing the heat treatment in a wet $O_2$ atmosphere can reduce nitrogen components in the insulating film that cause polarization. Thus the gate insulating film 12 made of silicon oxide is provided. Since the alignment mark AM1 gets thickened in the preceding step in this example, a concave-convex part 12A reflecting the concave-convex pattern of the alignment mark AM1, which is underlying, is created on the surface of the gate insulating film 12.

Here, a washing step can be added if necessary between the steps of forming a semiconductor film and forming a gate insulating film. More specifically, after finishing patterning the semiconductor film 11a, the substrate is irradiated with ultraviolet (UV) rays in an oxygen-containing atmosphere so as to resolve and remove contaminants (organic matters etc.) remaining on the surface of the substrate. The UV rays used here are provided by a low-pressure mercury lamp with its peak strength at a wavelength of 254 nm, or an excimer lamp with its peak strength at a wavelength of 172 nm. The light of a wavelength within this range converts oxygen molecules ($O_2$) into ozone ($O_3$), and further into oxygen radicals ($O^*$). Therefore, by using ozone or oxygen radicals produced here and having high degrees of activity, it is possible to efficiently remove organic matters attached to the surface of the substrate.

As shown in FIG. 1f, a gate wiring film 13 is deposited on the gate insulating film 12. The gate wiring film 13 is formed by depositing or stacking layers of adequate metal (e.g. tantalum, aluminum, titanium), metal nitride, polysilicon, or other materials by an adequate deposition method, such as sputtering, CVD, and evaporation. The gate wiring film 13 that is opaque is provided on the whole surface of the substrate in this step. Since the gate insulating film 12 has the concave-convex part 12A reflecting the thick-film alignment mark AM1 as mentioned above, a concave-convex part 13A reflecting this concave-convex pattern is created on the surface of the gate wiring film 13 as well.

Next, as shown in FIG. 1g, the gate wiring film 13 is patterned so as to form a gate wiring (wiring layer) 13a including a gate electrode. Since the surface of the gate wiring film 13 has a concave-convex pattern reflecting the pattern of the alignment mark AM1, which is underlying, in this example as mentioned above, it is possible to pattern the gate wiring film 13 with high accuracy of alignment with the semiconductor film 11a, which is underlying.

As shown in FIG. 2a, impurity ions are doped in the semiconductor film 11a by using the gate wiring 13a as a mask, and thereby forming a source region 11s and a drain region 11d. Since the gate wiring 13a serves as a mask for doping ions, a channel region 11c has a self-alignment structure that is provided only in a portion under the gate electrode. Here, ion doping and ion implantation can be used for this impurity ion doping. In the ion doping process, a hydride of an element to be doped as an impurity and hydrogen are doped by using a mass non-separation ion doping device. In the ion implantation process, only a desirable impurity element is doped by using a mass separation ion doping device. Examples of raw material gases used in the ion doping process may include a hydride of an element to be doped as an impurity, such as phosphine ($PH_3$) or diborane ($B_2H_6$), that is diluted in hydrogen.

Then, the impurity is activated. An adequate method can be used for this activation, for example, laser irradiation, heating in a furnace at a 300 degrees Celsius or higher (low-temperature heat treatment), and rapid thermal processing using a lamp.

As shown in FIG. 2b, another alignment mark AM2 is formed on the gate insulating film 12. The alignment mark AM2 is to be used for patterning a source wiring and a drain wiring that will be described later. More specifically, since an interlayer insulating film (functional film) provided between the source and drain wirings and the gate insulating film 12 is formed by liquid-phase processing in this example as will be described in greater detail, the alignment mark AM2 is made thick enough to prevent the concave-convex pattern of the alignment mark AM1 appearing on the surface of the gate insulating film 12 from being planarized by the interlayer insulating film. The height of the alignment mark AM2 is set high enough to remain above the level of planarization by the interlayer insulating film for this reason.

Resist or other insulating materials can be used to make the alignment mark AM2, like the alignment mark material 10b. Specifically, in order to make the alignment mark AM2 with a resist, the film of a transmissive resist is deposited on the whole surface of the substrate by spin coating, for example, and then the resist is patterned by using the alignment mark AM1, which is visible through this transmissive resist. In order to make the alignment mark AM2 with an insulating material other than a resist, the insulating material is dispersed in a solvent or dispersing medium such as xylene, and the solution (i.e., a liquid material containing an alignment mark material) is selectively dropped onto a region for forming the alignment mark AM1 by a droplet delivery method. Then the drops are dried or burned. Here, a droplet delivery head is aligned by using the alignment mark AM1, which is visible through the gate insulating film 12. Instead of this method, it should be understood that other known patterning methods (e.g., etching) can also be employed here.

In this step, the position of forming the alignment mark AM2 is not necessarily the same as that of the alignment mark AM1. If a sufficient alignment accuracy is assured between lower wiring layers (e.g., the gate wiring 13a) and higher wiring layers (e.g., source and drain wirings), the alignment mark AM2 can be formed in a different position. For example, if the relative position of the alignment mark AM2 is controlled based on the position of the alignment mark AM1, which is in a lower layer, it is at least possible to align upper wiring layers with lower wiring layers with a certain accuracy level. That is to say, even if the alignment mark AM2, which is the second alignment mark, is placed in a different position on the gate insulating film 12 with reference to the position of the alignment mark AM1, which is placed in a lower layer and serving as the first alignment mark, non-alignment between the upper and lower wirings can be prevented. Having said that, the alignment mark AM1 and the alignment mark AM2 placed in almost the same position on a plane surface can provide a higher alignment accuracy between the upper and lower wiring layers.

As shown in FIG. 2c, an interlayer insulating film (functional film) 14 is deposited on the whole surface of the substrate so as to cover the gate insulating film 12 and the gate wiring 13a. The forming method of the interlayer insulating film 14 is the same as that of the gate insulating film 12. Specifically, an embrocation containing xylene mixed with polysilazane (a liquid material containing polysilazane) is spin-coated on the substrate. Then, prebaking may be performed at 100 degrees Celsius for five minutes. Subsequently, heat treatment can be performed at 350 degrees Celsius in a wet $O_2$ atmosphere for 260 minutes.

Since the thick-film alignment mark AM2 is provided on the gate insulating film 12 in the preceding step in this example, a concave-convex part 14A reflecting the concave-convex pattern of the alignment mark AM2, which is underlying, is created on the surface of the interlayer insulating film 14.

As shown in FIG. 2d, a contact hole H1 is formed in a position corresponding to a source region of the interlayer insulating film 14 and the gate insulating film 12. A contact hole H2 is formed in a position corresponding to a drain region of the interlayer insulating film 14 and the gate insulating film 12.

As shown in FIG. 2e, a metal film 15 of aluminum, chromium, tantalum, or the like is deposited by sputtering, PVD, or other methods so as to cover the inner wall of the contact holes H1 and H2. In this step, the metal film 15 that is opaque is provided on the whole surface of the substrate. Since the interlayer insulating film 14 has the concave-convex part 14A reflecting the thick-film alignment mark AM2 as mentioned above, a concave-convex part 15A reflecting this concave-convex pattern is created on the surface of the metal film 15 as well.

Next, as shown in FIG. 2f, the metal film 15 is patterned so as to form a source wiring (wiring layer) 15a including a source electrode and a drain wiring (wiring layer) 15b including a drain electrode. The surface of the metal film 15 has a concave-convex pattern reflecting the pattern of the alignment mark AM2, which is underlying, in this example as mentioned above. Therefore, it is possible to pattern the metal film 15 with high accuracy of alignment with the semiconductor film 11a and the gate wiring 13a, which are underlying.

Here, on the source electrode 15a and the drain electrode 15b, a protective film can be provided by depositing silicon oxide, silicon nitride, phosphosilicate glass (PSG), or the like if necessary. A thin-film transistor (semiconductor device) 1 is thus manufactured through the above-mentioned steps.

As described above, the method for manufacturing a semiconductor device of the exemplary embodiment can include liquid-phase processing in part of its manufacturing steps, which provides highly flat film surfaces. Therefore, no breaking or other problems occur in forming wirings because of a step between them, which makes it possible to manufacture highly reliable transistors with a high yield ratio.

Also in the embodiment, before forming functional films (the gate insulating film 12 and the interlayer insulating film 14 in this example) by liquid-phase processing, an alignment mark is thickened and made into a thick-film alignment mark, so that the pattern of the alignment mark will not get buried in the functional films. In other words, the pattern of the alignment mark appears on films formed after forming the functional films. Therefore, the films formed after forming the functional films can be patterned with high accuracy of alignment with an underlying semiconductor film, wiring layer, etc.

Figure 3:
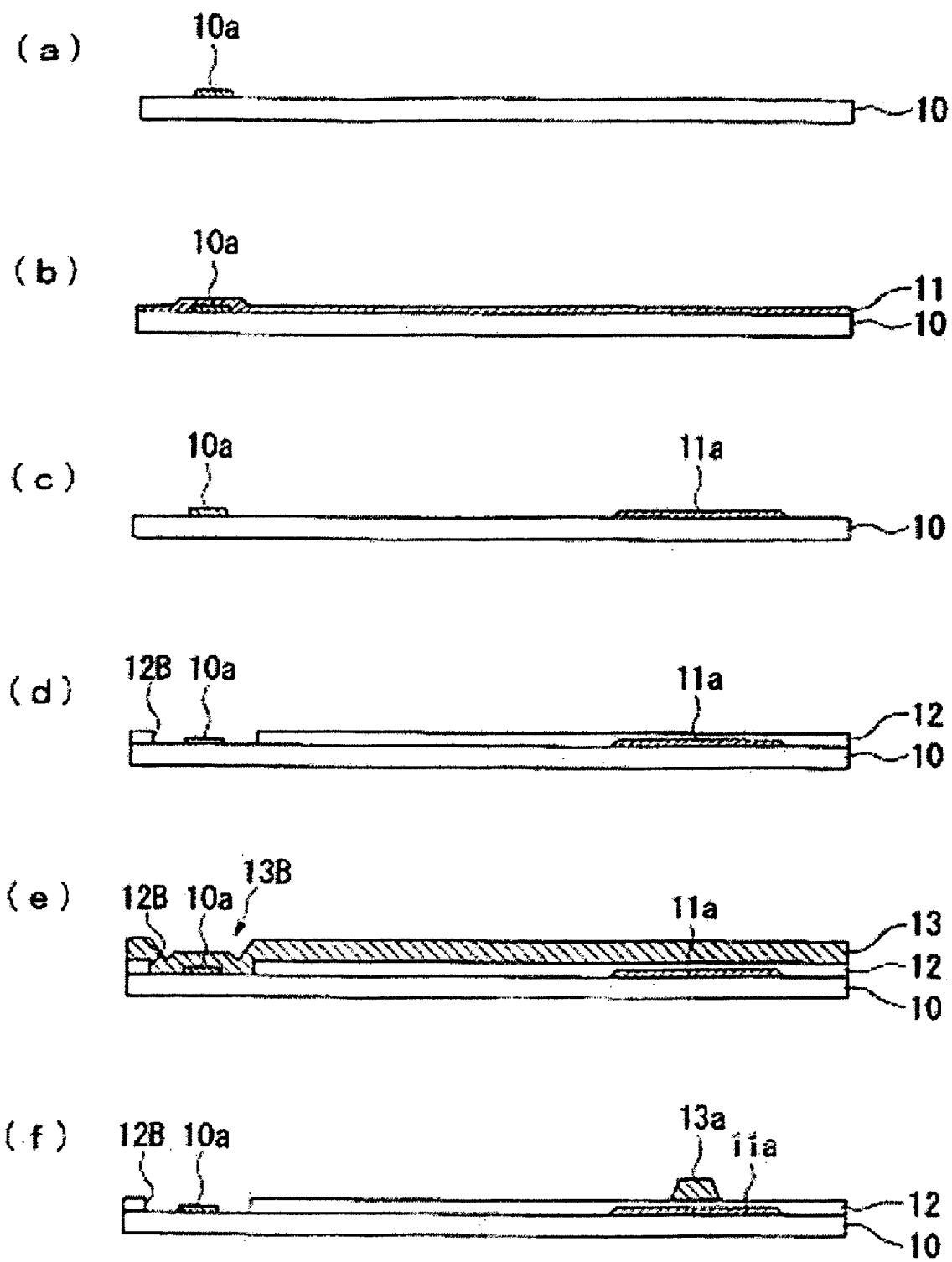
FIG. 3 is a process drawing illustrating a method for manufacturing a semiconductor device of a second exemplary embodiment of the invention.
Figure 4:
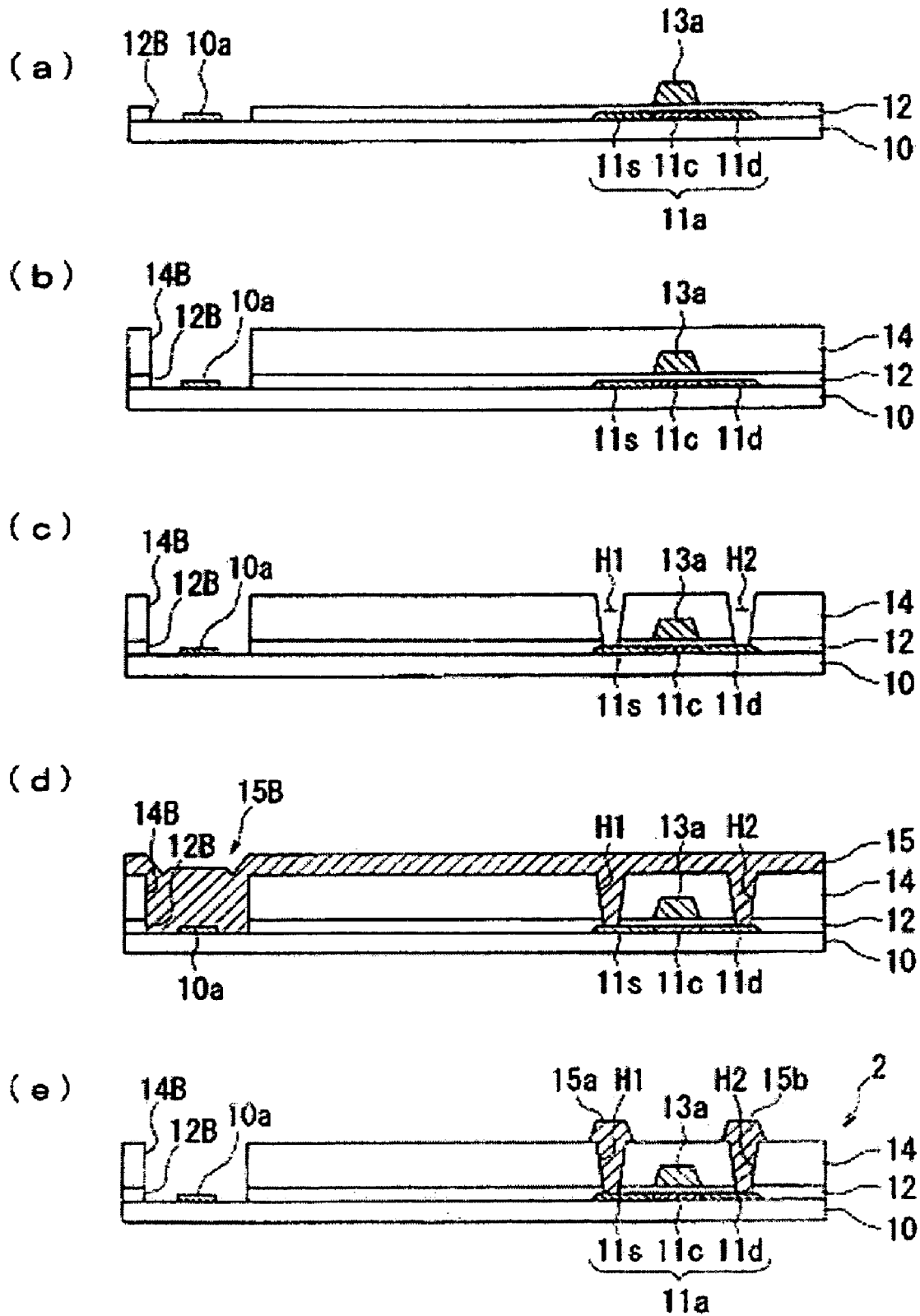
FIG. 4 is a process drawing illustrating steps following the steps shown in FIG. 3.

Referring now to FIGS. 3 and 4, a second exemplary embodiment of the invention will be described. FIGS. 3 and 4 are process drawings illustrating a method for manufacturing a TFT which is an example of semiconductor devices according to the exemplary embodiment. The drawings schematically show a transistor forming region and an alignment mark forming region in a magnified form. In this embodiment, the same members and elements as those in the first embodiment will be given the same reference numerals, and further description thereof will be omitted.

The substrate 10 having the alignment mark (first alignment mark) 10a, as shown in FIG. 3a, is provided as a substrate for manufacturing a semiconductor device (substrate for a semiconductor device). On the substrate 10, a semiconductor film made of amorphous silicon or the like is deposited as shown in FIG. 3b. Then the semiconductor film is crystallized by laser annealing, for example, and isolated by etching, for example. Through these steps, the polycrystalline semiconductor film 11a having a predetermined shape as shown in FIG. 3c is formed on the substrate 10. This process is the same as that of the first exemplary embodiment.

As shown in FIG. 3d, the gate insulating film (functional film) 12 of TFT is deposited on the semiconductor film 11a by liquid-phase processing. In this example, the gate insulating film 12 is provided in a region other than the region for forming the alignment mark 10a. In order to provide the gate insulating film 12 only in a predetermined region, the following methods can be used.

(1) Providing the region for forming the alignment mark 10a with liquid repellency, and then depositing a liquid material containing a material for forming the gate insulating film 12 in a region including the liquid repellent region on the substrate.

(2) Forming the gate insulating film 12 in a region including the region for forming the alignment mark 10a on the substrate, and then selectively removing the gate insulating film 12 that is positioned on the alignment mark 10a by etching, for example.

(3) Selectively dropping a liquid material containing a material for forming the gate insulating film 12 in a region other than the region for forming the alignment mark 10a by a droplet delivery method, and then drying or burning the material.

In order to control the liquid repellency (wettability) of the substrate surface in the method (1), for example, the method of forming a self-assembled film composed of an organic molecular film or the like on the substrate surface, or the method including plasma treatment can be used.

In the method for forming a self-assembled film, a self-assembled film composed of an organic molecular film or the like is formed on the substrate surface on which the gate insulating film 12 is to be formed. The organic molecular film has a first functional group that can bond with the substrate, a second functional group that modifies the properties of the substrate surface (controlling surface energy) such as a lyophilic or lyophobic group on the opposite side of the first functional group, and a normal or partially branched carbon chain that interconnects these functional groups. For example, fluoroalkylsilane (hereinafter called "FAS"), such as: heptadecafluoro-1,1,2,2-tetrahydrodecyltriethoxysilane; heptadecafluoro-1,1,2,2-tetrahydrodecyltrimethoxysilane; heptadecafluoro-1,1,2,2-tetrahydrodecyltrichlorosilane; tridecafluoro-1,1,2,2-tetrahydrooctyltriethoxysilane; tridecafluoro-1,1,2,2-tetrahydrooctyltrimethoxysilane; tridecafluoro-1,1,2,2-tetrahydrooctyltrichlorosilane; and trifluoropropyltrimethoxysilane can be used here. One of these compounds may be used alone, or alternatively two or more of them may be used in combination. Using FAS can provide high adhesiveness to the substrate and good liquid repellency. This organic molecular film can be easily patterned by being irradiated with ultraviolet rays or the like.

In the method including plasma treatment, the substrate is irradiated with plasma at normal pressure or in a vacuum. A kind of gas for the plasma treatment is selected considering, for example, the surface material of the substrate on which a conductive wiring is to be formed. The treatment gas used here could be tetrafluoromethane, perfluorohexane, or perfluorodecane or the like.

Provided on the surface of the substrate that has been treated as mentioned above is a gate insulating film. Specifically, an embrocation containing xylene mixed with polysilazane (a liquid material containing polysilazane) is spin-coated on the substrate. Then, prebaking is performed at 100 degrees Celsius for five minutes. Subsequently, heat treatment is performed at 350 degrees Celsius in a wet $O_2$ atmosphere for 260 minutes.

In the method (2) above, first the gate insulating film 12 composed of a polysilazane burned film is formed in the same manner as described in the first exemplary embodiment, and then part of the film is selectively removed by etching, for example. The gate insulating film can be removed by the following methods.

(a) Using a transmissive gate insulating film, and selectively removing the gate insulating film 12 that is positioned on the alignment mark 10a by using the alignment mark 10a, which is visible through the transmissive gate insulating film 12.

(b) Selectively removing the gate insulating film 12 in a given range in which the alignment mark 10a is considered to be provided.

According to the above method (a), the position of the alignment mark 10a can be detected, and then only the gate insulating film 12 that is placed in this position is removed accurately. According to the above method (b), when the position of the alignment mark 10a is known to a certain extent, the gate insulating film 12 that is placed in and near a position in which the alignment mark 10a is considered to be provided is roughly removed. The method (b) does not necessarily require a transmissive film as the gate insulating film 12, and an opaque material can also be used. This way the gate insulating film 12 having an opening 12B in the region for forming the alignment mark 10a is provided.

As shown in FIG. 3e, the gate wiring film 13 can be deposited on the whole surface of the substrate. The gate wiring film 13 is formed by depositing or stacking layers of adequate metal (e.g. tantalum, aluminum, titanium), metal nitride, polysilicon, or other materials by an adequate deposition method, such as sputtering, CVD, and evaporation. The gate wiring film 13 that is opaque is provided on the whole surface of the substrate in this step. Since the gate insulating film 12 has the opening 12B so as to expose the alignment mark 10a as mentioned above, a concave-convex part 13B reflecting the concave-convex pattern of the alignment mark 10a is created on the surface of the gate wiring film 13 as well.

Next, as shown in FIG. 3f, the gate wiring film 13 is patterned so as to form the gate wiring (wiring layer) 13a including a gate electrode. Since the surface of the gate wiring film 13 has a concave-convex pattern reflecting the pattern of the alignment mark 10a, which is underlying, in this example as mentioned above, it is possible to pattern the gate wiring film 13 with high accuracy of alignment with the semiconductor film 11a, which is underlying.

As shown in FIG. 4a, impurity ions are doped in the semiconductor film 11a by using the gate wiring 13a as a mask, and thereby forming the source region 11s and the drain region 11d. Since the gate wiring 13a serves as a mask for doping ions, the channel region 11c has a self-alignment structure that is provided only in a portion under the gate electrode.

Then, the impurity is activated. An adequate method can be used for this activation, for example, laser irradiation, heating in a furnace at a 300 degrees Celsius or higher (low-temperature heat treatment), and rapid thermal processing using a lamp.

As shown in FIG. 4b, an interlayer insulating film (functional film) 14 can be deposited by liquid-phase processing so as to cover the gate insulating film 12 and the gate wiring 13a. In this example, the interlayer insulating film 14 is provided in a region other than the region for forming the alignment mark 10a. In order to form the interlayer insulating film 14 in such a manner, the methods similar to those described in the preceding step for forming the gate insulating film can be used. This way the interlayer insulating film 14 having an opening 14B communicating with the opening 12B of the gate insulating film 12 is provided on the gate insulating film 12.

As shown in FIG. 4c, the contact hole H1 is formed in a position corresponding to a source region of the interlayer insulating film 14 and the gate insulating film 12. The contact hole H2 is formed in a position corresponding to a drain region of the interlayer insulating film 14 and the gate insulating film 12.

As shown in FIG. 4d, a metal film 15 of aluminum, chromium, tantalum, or the like is deposited by sputtering, PVD, or other methods so as to cover the inner wall of the contact holes H1 and H2 and the openings 14B and 12B. The metal film 15 that is opaque is provided on the whole surface of the substrate in this step. Since the interlayer insulating film 14 has the opening 14B so as to expose the alignment mark 10a as mentioned above, a concave-convex part 15B reflecting the concave-convex pattern of the alignment mark 10a is created on the surface of the metal film 15 as well.

Next, as shown in FIG. 4e, the metal film 15 is patterned so as to form the source wiring (wiring layer) 15a including a source electrode and the drain wiring (wiring layer) 15b including a drain electrode. The surface of the metal film 15 has a concave-convex pattern reflecting the pattern of the alignment mark 10a, which is underlying, in this example as mentioned above. Therefore, it is possible to pattern the metal film 15 with high accuracy of alignment with the semiconductor film 11a and the gate wiring 13a, which are underlying.

Here, on the source electrode 15a and the drain electrode 15b, a protective film can be provided by depositing silicon oxide, silicon nitride, PSG, or the like if necessary. A thin-film transistor (semiconductor device) 2 is thus manufactured through the above-mentioned steps.

According to the method for manufacturing a semiconductor device of the exemplary embodiment that has been described, the pattern of the alignment mark appears on films formed after forming the functional films by liquid-phase processing. Therefore, the films formed after forming the functional films can be patterned with high accuracy of alignment with an underlying semiconductor film, wiring layer, etc.

Figure 5:
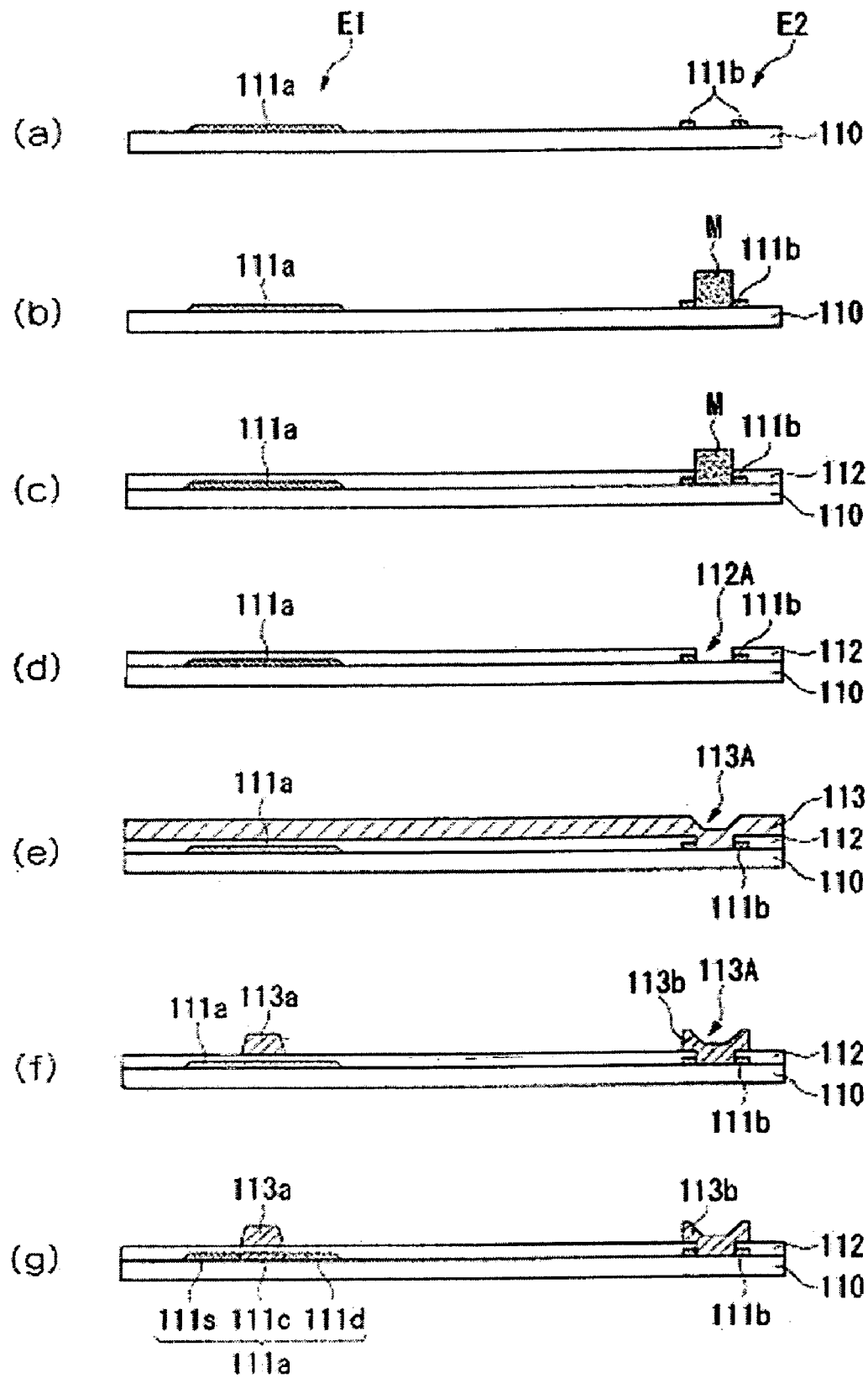
FIG. 5 is a process drawing illustrating a method for manufacturing a thin-film transistor of a third exemplary embodiment of the invention.
Figure 6:
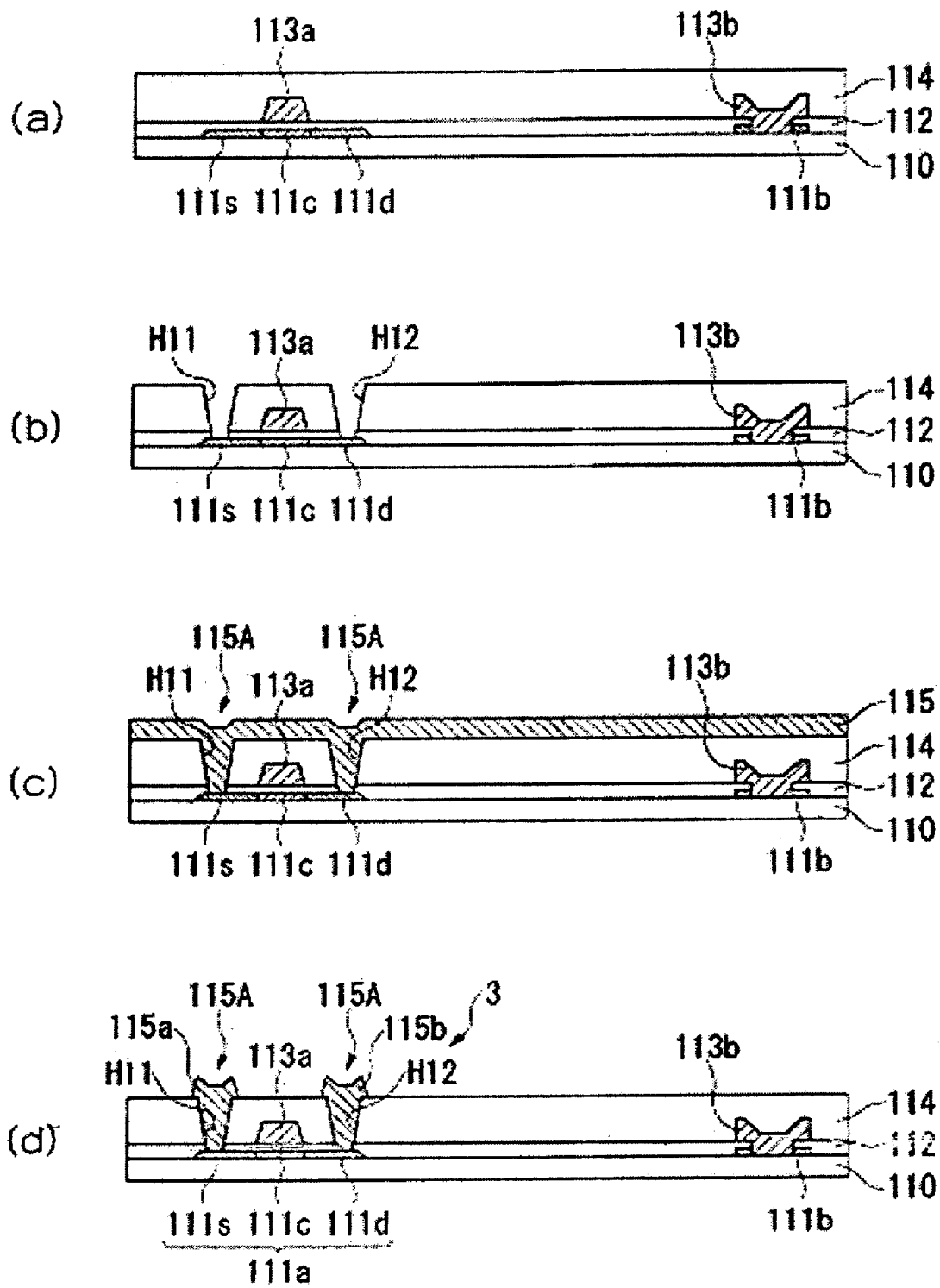
FIG. 6 is a process drawing illustrating steps following the steps shown in FIG. 5.

Referring now to FIGS. 5 and 6, a third exemplary embodiment of the present embodiment will be described. FIGS. 5 and 6 are process drawings illustrating a method for manufacturing a TFT which is an example of semiconductor devices according to the present embodiment. The drawings are sectional views schematically showing a TFT forming region (element area) E1 and an alignment mark forming region (alignment area) E2 in a magnified form.

First, a substrate 110 for manufacturing a TFT is provided. Examples of the substrate 110 may include both insulating substrates made of quartz, glass, heat-resistant plastic, etc., and conductive substrates made of semiconductor materials including silicon wafers, stainless materials, etc. On the surface of the substrate 110, an underlying protective film made of an insulating material, such as a silicon oxide film, silicon nitride film, or silicon oxide nitride film, can be formed if necessary, so that sodium and other moving ions contained in the substrate do not get mixed in a semiconductor film that will be described below.

Next, a semiconductor film for forming an active layer of a TFT is formed on the substrate 110. While the semiconductor film is an amorphous silicon film in this example, the semiconductor film may be made of other semiconductor materials such as germanium. Otherwise, semiconductor films of a complex of Group IV elements, e.g., silicon and germanium, silicon and carbide, germanium and carbide; semiconductor films of a complex compound of Group III and Group V elements, e.g., gallium and arsenic, indium and antimony; and semiconductor films of a complex compound of Group II and Group VI elements, e.g., cadmium and selenium can be used. In addition, semiconductor films of a further complex compound, such as silicon, germanium, gallium, and arsenic; N-type semiconductor films that are such semiconductor films in which donor elements of, for example, phosphorous (P), arsenic (As), or antimony (Sb) are doped; and P-type semiconductor films that are such semiconductor films in which acceptor elements of, for example, boron, aluminum (Al), gallium (Ga), or indium (In), are doped can also be used.

The semiconductor film can be formed by CVD such as APCVD, LPCVD, and PECVD, and PVD such as sputtering and evaporation.

The semiconductor film, which has been deposited, is then crystallized. Here, crystallization means providing an amorphous semiconductor film with thermal energy so as to transform it into a polycrystalline or single crystal silicon film, and also means providing a microcrystalline or polycrystalline semiconductor film with thermal energy so as to recrystallize it by improving the quality of the crystalline film or by melting and solidifying it. In this specification, crystallization refers not only to the crystallization of amorphous substances, but also to the crystallization of polycrystalline and microcrystalline substances.

Examples of crystallization processing of the semiconductor film may include, but not be limited to, laser irradiation, rapid heating (e.g. lamp annealing, thermal annealing), and solid-phase growth. Laser annealing is employed in this example to crystallize the semiconductor film, which is amorphous, so as to transform it into a polycrystalline semiconductor film (e.g. polysilicon film). Here, an excimer laser, argon ion laser, the second and third harmonic of a YAG laser, etc. with a wavelength within or around the range of UV rays are preferably used as laser light. For example, a line beam of an excimer laser whose longer length is 400 mm with an output strength of 400 mJ/cm$^2$ can be used. It is desirable to scan a line beam with the parts corresponding to 90% of the peak value of its laser strength in its shorter length direction overlapped in each region.

The semiconductor film can be patterned so as to form a first semiconductor film 111a to be the active layer of a TFT and a second semiconductor film 111b serving as a first alignment mark in the element area E1 and the alignment area E2, respectively. The second semiconductor film 111b will be used for the alignment of a film formed after forming the first semiconductor film 111a (e.g. a gate wiring). Known shapes and other properties of the second semiconductor film 111b can be used here. For example, while the shape of the alignment mark 111b is a cross in a square in this example, it could also be square, cross, or dogleg. The alignment area E2, in which the alignment mark 111b is formed, is provided on the right and left rims of the substrate 110, and is separated from the element area E1, in which a TFT is formed, provided at a central part of the substrate. The drawings show the alignment area E2 on one side. This process forms the semiconductor film 111a that is polycrystalline and has a predetermined shape, and the alignment mark 111b as shown in FIG. 5A on the substrate 110.

As shown in FIG. 5b, a pillar-shaped mask pillar (mask member) M is formed in the alignment area E2. The mask pillar M will be used for forming an opening 112A communicating with the alignment mark 111b in a gate insulating film 112 that will be described below. In this example, by exposing the alignment mark 111b through the opening 112A, the pattern of the alignment mark 111b appears on the surface of a gate wiring film 113 formed on the gate insulating film 112. This makes it possible to align a gate wiring 113a with the first semiconductor film 111a, which is underlying.

The mask pillar M can be formed by applying a light-sensitive material, such as a resist, on the whole surface of the substrate, and then performing exposure, development, baking, and other processing. Alternatively, the mask pillar M can be formed by selectively dropping a liquid material containing an insulating material on a position for forming the opening 112A by a droplet delivery method, and then drying or burning the material.

The thickness (height) of the mask pillar M can be set equal to or more than the thickness of the gate insulating film 112 formed afterward. This way the mask pillar M remains above the gate insulating film 112. In other words, the upper part of the mask pillar M projects from the surface of the gate insulating film 112. While the mask pillar M is formed in a planar area of the alignment mark 111b in this example, it should be understood that the position for forming the mask pillar M is not limited to this. For example, the mask pillar M can be placed at a different position in the alignment area E2 as long as the relative position of the mask pillar M to the alignment mark 111b is controlled. In this case, although the alignment mark 111b is not exposed through the opening of the gate insulating film 112, the surface of the gate wiring film 113 formed on the gate insulating film 112 has a concave part reflecting the opening. By using a concave-convex pattern of the concave part, it is possible to align the gate wiring film 113 with the semiconductor film 111a, which is underlying, with high accuracy.

The mask pillar M can be hardened if necessary. Hardening of the mask pillar M is performed as mentioned below. First, the substrate 110 having the mask pillar M is placed in a vacuum chamber (not shown). The pressure in the chamber is then reduced to 1.3 kPa (10 Torr) or less, for example, down to about 0.2 Torr. Subsequently, the mask pillar M is heated to a typical photoresist postbaking temperature, for example to 100 to 150 degrees Celsius (up to 130 degrees Celsius, for example), and also irradiated with UV rays of a wavelength of about 254 nm, for example, for several minutes. This process makes moisture dissolved and remaining in the mask pillar M evaporate, and promotes cross-linking reactions by the UV rays. Since the mask pillar M is not influenced by oxygen and moisture, it becomes densified by cross-linking reactions and improves its heat and chemical resistance.

Moreover, hardening of the mask pillar M can be performed by heat treatment that heats the mask pillar M up to more than the postbaking temperature if necessary. This heat treatment is performed at, for example, 300 to 450 degrees Celsius for ten minutes. This process provides the mask pillar with excellent heat and chemical resistance, and thereby a variety of liquid film-forming materials can be used. Here, UV-ray irradiation is not necessarily performed under reduced pressure. For example, it can be performed in an atmosphere where oxygen and moisture are substantially absent (e.g., in a nitrogen atmosphere).

As shown in FIG. 5c, the gate insulating film 112 composed of silicon oxide etc. is deposited around the mask pillar M, that is, on the whole surface of the substrate except for the mask pillar M, by liquid-phase processing. First, an embrocation containing xylene mixed with polysilazane (a liquid material containing polysilazane) is spin-coated on the substrate. Then, prebaking is performed at 100 to 150 degrees Celsius for five minutes. In order to prevent the liquid material from attaching to the upper part of the mask pillar M in this step, it is preferable to provide the mask pillar M with liquid repellency in advance. Providing the mask pillar M with liquid repellency can be carried out by breaking a gas containing fluorine elements such as carbon tetrafluoride down into active fluorine monatomic elements and ions by using atmospheric pressure plasma, and exposing the mask pillar to the active fluorine. If the mask pillar M is formed by using a liquid repellent photoresist containing fluorine elements, this liquid repellency process is not needed. Thus the gate insulating film 112 is provided.

While spin coating is used for applying the liquid material in this example, other known application methods, such as dip coating, roll coating, curtain coating, spraying, and droplet delivery (e.g. ink jetting) can also be used. As the liquid material, other materials than polysilazane, such as polyimide and high-K materials dispersed and dissolved in a certain solvent such as xylene can also be used.

Here, a washing step can be added if necessary between the steps of forming a semiconductor film and forming a gate insulating film. More specifically, after finishing patterning the semiconductor films 111a and 111b, the substrate is irradiated with UV rays in an oxygen-containing atmosphere so as to resolve and remove contaminants (organic matters etc.) remaining on the surface of the substrate. The UV rays used here are provided by a low-pressure mercury lamp with its peak strength at a wavelength of 254 nm, or an excimer lamp with its peak strength at a wavelength of 172 nm. The light of a wavelength within this range converts oxygen molecules ($O_2$) into ozone ($O_3$), and further into oxygen radicals (O*). Therefore, by using ozone or oxygen radicals produced here and having high degrees of activity, it is possible to efficiently remove organic matters attached to the surface of the substrate.

As shown in FIG. 5d, the mask pillar M is removed with a separating liquid (e.g., hot concentrated sulfuric acid). Thus, the gate insulating film 112 is provided with the opening 112A through which the alignment mark 111b is exposed.

Subsequently, polysilazane contained in the gate insulating film 112 is burned. The burning of polysilazane is carried out by heat treatment at 300 to 400 degrees Celsius in a wet $O_2$ atmosphere for 60 minutes. Performing the heat treatment in a wet $O_2$ atmosphere can reduce nitrogen components in the insulating film that cause polarization. Thus polysilazane contained in the gate insulating film 112 is completely transformed into a silicon oxide film. In this example, since the mask pillar M made of a resist etc. which is not highly resistant to heat remains on the substrate, only prebaking is performed in the step of forming a gate insulating film, and polysilazane is burned after removing the mask pillar. If the mask pillar is made of a highly heat resistant inorganic material (e.g. a liquid material containing polysilazane or metal micro-particles), polysilazane can be burned with the mask pillar M remaining on the substrate. Also, if the mask pillar M is made of an organic material whose heat resistance is enhanced by hardening as mentioned above, polysilazane can be burned with the mask pillar M remaining on the substrate. This enables heat treatment (prebaking and burning) to the polysilazane gate insulating film to be carried out in a single step, which simplifies the process.

As shown in FIG. 5e, the gate wiring film 113 is deposited on the gate insulating film 112 so as to cover the surface of the gate insulating film 112 and the inside of the opening 112A. The gate wiring film 113 is formed by depositing or stacking layers of adequate metal (e.g. tantalum, aluminum, titanium), metal nitride, polysilicon, or other materials to a thickness of, for example, about 300 to 500 nm by an adequate method, such as sputtering, CVD, and evaporation. The gate wiring film 113 that is opaque is provided on the whole surface of the substrate in this step. Since the gate insulating film 112 has the opening 112A through which the first alignment mark 111b is exposed as mentioned above, a concave-convex part 113A reflecting the pattern of the first alignment mark 111b is created on the surface of the gate wiring film 113 as well.

Next, as shown in FIG. 5f, the gate wiring film 113 is patterned so as to form the gate wiring 113a including a gate electrode in the element area E1 and a second alignment mark 113b having the concave-convex part 113A in the alignment area E2. Since the surface of the gate wiring film 113 has a concave-convex pattern (i.e. the concave-convex part 113A) reflecting the pattern of the alignment mark 111b, which is underlying, in this example as mentioned above, it is possible to pattern the gate wiring film 113 with high accuracy of alignment with the semiconductor film 111a, which is underlying, by using the concave-convex part 113A as an alignment mark.

As shown in FIG. 5g, impurity ions are doped in the semiconductor film 111a by using the gate wiring 113a as a mask, and thereby forming a source region 111s and a drain region 111d in the semiconductor film 111a. Since the gate wiring 113a serves as a mask for doping ions, a channel region 111c has a self-alignment structure that is provided only in a portion under the gate electrode. Here, ion doping and ion implantation can be used for this impurity ion doping. In the ion doping process, a hydride of an element to be doped as an impurity and hydrogen are doped by using a mass non-separation ion doping device. In the ion implantation process, only a desirable impurity element is doped by using a mass separation ion doping device. Examples of raw material gases used in the ion doping process may include a hydride of an element to be doped as an impurity, such as phosphine ($PH_3$) or diborane ($B_2H_6$), that is diluted in hydrogen.

As shown in FIG. 6a, an interlayer insulating film 114 can be deposited on the whole surface of the substrate so as to cover the gate insulating film 112, the gate wiring 113a, and the second alignment mark 113b. The forming method of the interlayer insulating film 114 is the same as that of the gate insulating film 112. First, an embrocation containing xylene mixed with polysilazane (a liquid material containing polysilazane) is spin-coated on the substrate. Then, prebaking is performed at 100 to 150 degrees Celsius for five minutes. Subsequently, heat treatment is performed at 300 to 400 degrees Celsius in a wet $O_2$ atmosphere for 60 minutes. While the last heat treatment is carried out also for activating the impurity doped in the semiconductor film 111a, the step of activating an impurity can be performed following the step of doping an impurity. In this case, an adequate method can be used for this activation, for example, laser irradiation, heating in a furnace at a 300 degrees Celsius or higher (low-temperature heat treatment), and rapid thermal processing using a lamp.

As shown in FIG. 6b, an opening (contact hole) H11 is formed in a position corresponding to a source region of the interlayer insulating film 114 and the gate insulating film 112. An opening (contact hole) H12 is formed in a position corresponding to a drain region of the interlayer insulating film 114 and the gate insulating film 112.

As shown in FIG. 6c, a metal film 115 of aluminum, chromium, tantalum, or the like is deposited by sputtering, PVD, or other methods so as to cover the surface of the interlayer insulating film 114 and the inside of the openings H11 and H12. In this step, the metal film 115 that is opaque is provided on the whole surface of the substrate. Since the concave-convex part 114 has the openings H11 and H12, a concave-convex part 115A reflecting the concave-convex patterns of the contact holes H11 and H12 is formed on the surface of the metal film 115.

Next, as shown in FIG. 6d, the metal film 115 is patterned so as to form a source wiring 115a including a source electrode and a drain wiring 115b including a drain electrode. Since the surface of the metal film 115 has a concave-convex pattern (i.e., the concave-convex part 115A), which is underlying, in this example as mentioned above, it is possible to pattern the metal film 115 with high accuracy of alignment with the semiconductor film 111a and the gate wiring 113a, which are underlying, by using the concave-convex part 11 SA as an alignment mark.

Here, on the source electrode 115a and the drain electrode 115b, a protective film can be provided by depositing silicon oxide, silicon nitride, PSG, or the like if necessary. A thin-film transistor 3 is thus manufactured through the above-mentioned steps.

As described above, the method for manufacturing a semiconductor device of the exemplary embodiment can include liquid-phase processing in part of its manufacturing steps, which provides highly flat film surfaces. Therefore, no breaking or other problems occur in forming wirings because of a step between them, which makes it possible to manufacture highly reliable transistors with a high yield ratio.

Also in the exemplary embodiment, before forming a conductive film on insulating films (the gate insulating film 112 and the interlayer insulating film 114 in this example) by liquid-phase processing, an opening is provided to the insulating films so as to expose an underlying alignment mark. By providing the insulating films with an opening, the pattern of the alignment mark appears on films formed after forming the insulating films. Therefore, the films formed after forming the insulating films can be patterned with high accuracy of alignment with a semiconductor film, a wiring layer, etc. which are underlying.

The gate insulating film 112 is formed in a region other than the region for forming the alignment mark 111b by forming and removing the mask pillar M in this exemplary embodiment. Instead of this, a structure that is similar to the present embodiment can be achieved by forming the film of the gate insulating film 112 on the whole surface of the substrate, and then removing the gate insulating film that is positioned in the region for forming the alignment mark 111b by a typical photo etching technique. However, the method according to the present embodiment that involves the forming and removing of the mask pillar M can surely provide an opening in the gate insulating film corresponding to the alignment mark, even if the gate insulating film is made of an opaque material.

Also in this exemplary embodiment, the mask pillar M is formed in a planar area of the alignment mark 111b. However, the position for forming the mask pillar M is not limited to this. The mask pillar M can be placed in a different position as long as the relative position between the mask pillar and the alignment mark is controlled. In other words, if the mask pillar M is provided at least in alignment with the alignment mark 111b, the above-mentioned effects can be achieved. However, the method according to the present embodiment that forms the mask pillar M in a planar area of the alignment mark 111b can make the pattern of the alignment mark 111b appear on the surface of the gate wiring film 113, and thereby providing higher alignment accuracy than the method forming the mask pillar M in a different position.

Figure 7:
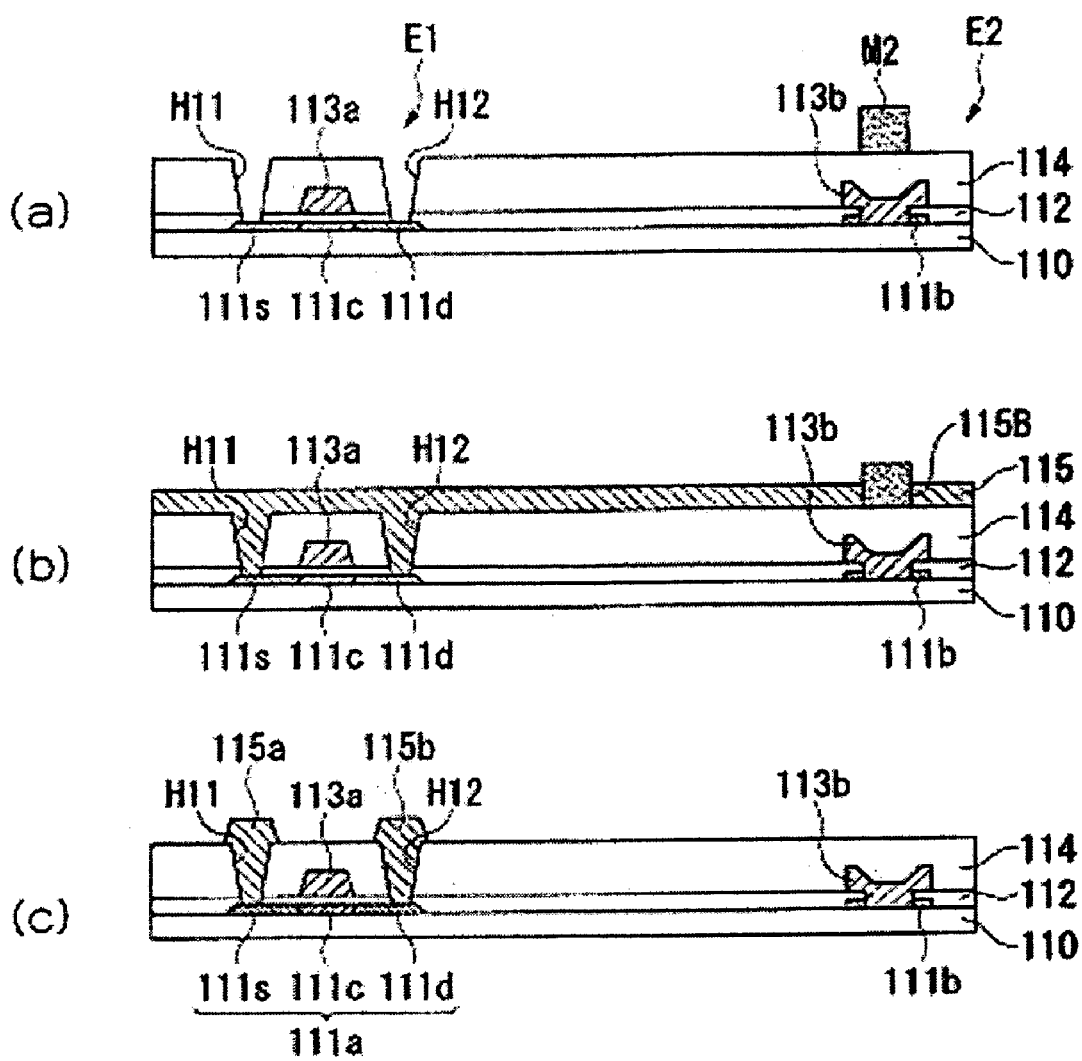
FIG. 7 is a process drawing illustrating a method for manufacturing a thin-film transistor of a fourth exemplary embodiment of the invention.

Referring now to FIG. 7, a fourth exemplary embodiment of the invention will be described. In this embodiment, the same members and elements as those in the third exemplary embodiment will be given the same reference numerals, and further description thereof will be omitted.

The embodiment can include forming of the source electrode 115a and the drain electrode 115b in a different way from the first embodiment. More specifically, while the metal film 115 is formed by vacuum processing, such as sputtering, in the first exemplary embodiment, the metal film 115 is formed by liquid-phase processing, such as spin coating, in the exemplary embodiment. In this case, however, if the metal film 115 is thickly formed, an underlying concave-convex pattern is not reflected on the surface of the film. Accordingly, merely spin coating the metal film 115 cannot make alignment in a subsequent etching step. Therefore, it is necessary to provide what serves as an alignment mark on the substrate by some kind of method before forming the metal film.

FIG. 7 is a process drawing showing one example of such a method. According to the method, a pillar-shaped mask a pillar (mask member) M2 is formed in the alignment area E2 in the state shown in FIG. 6b (see FIG. 7a). The mask pillar M2 will be used for forming an opening 115B (metal film 115 non-forming region) in the metal film 115 that will be described below. The position of forming the mask pillar M2 is not necessarily the same as that of the alignment mark 111b. However, since it is necessary to accurately align the metal film 115 with the semiconductor film 111a, which is underlying, at least the position of the mask pillar M2 is determined based on the position of the alignment mark 111b. In this example, the source wiring 115a and the drain wiring 115b are aligned with the semiconductor film 111a, which is underlying, by using the opening 115B as an alignment mark.

The forming method of the mask pillar M2 is the same as that of the mask pillar M. The thickness (height) of the mask pillar M2 is set equal to or more than the thickness of the metal film 115 formed afterward. This way the mask pillar M2 remains above the metal film 115. In other words, the upper part of the mask pillar M2 projects from the surface of the metal film 115.

As shown in FIG. 7b, a liquid material containing metal is spin coated around the mask pillar M2, that is, on the whole surface of the substrate except for the mask pillar M2, by liquid-phase processing. Then, the material is dried and burned to make the metal film (functional film) 15. The mask pillar M2 can be removed before the burning if necessary. If the mask pillar M2 is hardened as described earlier, it is not necessary to remove the mask pillar M2 before the burning.

By making the mask pillar M2 in advance as just described, the metal film 15 is provided with the opening 115B at the position of the mask pillar M2. Next, as shown in FIG. 7c, the metal film 115 is patterned so as to form the source wiring 115a including a source electrode and the drain wiring 115b including a drain electrode. Here, by using the opening 115B as an alignment mark, it is possible to pattern the metal film 115 with high accuracy of alignment with the semiconductor film 111a and the gate wiring 113a, which are underlying.

In the exemplary embodiment as described above, since the mask pillar M2 is provided on the substrate based on an underlying alignment mark before forming an opaque metal film by liquid-phase processing, the metal film 115 formed afterward is provided with the opening 115B (non-forming region) corresponding to the mask pillar M2. Accordingly, by using the opening 115B as another alignment mark, it is possible to pattern the metal film 115 with high accuracy of alignment with the semiconductor film 111a, which is underlying.

While this method is used for forming the source wiring etc. in the embodiment, it can be adopted for other steps as well, such as the step of forming the gate wiring 113a. Also in the embodiment, the metal film is given as an example of functional films, but it is not intended to limit the types of such functional films. For example, this method can also be used for patterning transparent films, such as insulating films. However, this method is more effective for patterning opaque films of metal etc. for the above-mentioned characteristic.

Figure 8:
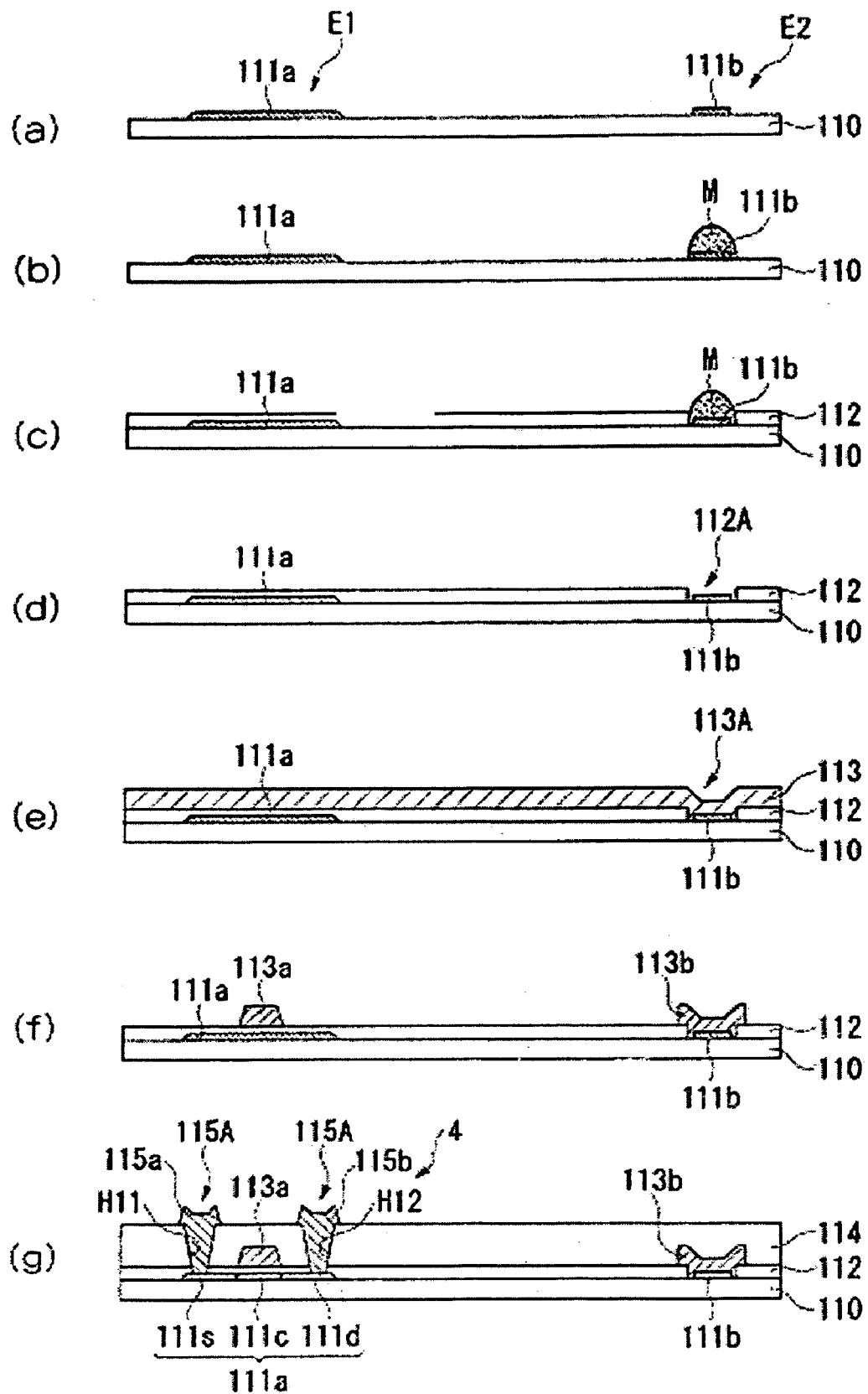
FIG. 8 is a process drawing illustrating a method for manufacturing a thin-film transistor of a fifth exemplary embodiment of the invention.

Referring now to FIG. 8, a fifth exemplary embodiment of the invention will be described. FIG. 8 is a process drawing illustrating a method for manufacturing a TFT according to the embodiment. The drawing is a sectional view schematically showing the TFT forming region (element area) E1 and the alignment mark forming region (alignment area) E2 in a magnified form. In this embodiment, the same members and elements as those in the third exemplary embodiment will be given the same reference numerals, and further description thereof will be omitted.

On the substrate 110, a semiconductor film made of amorphous silicon or the like is formed. Then the semiconductor film is crystallized by laser annealing, for example, and patterned by etching, for example. As shown in FIG. 8*a*, this process forms the amorphous semiconductor film (first semiconductor film) 111*a* having a predetermined shape in the element area E1, and also forms the second semiconductor film 111*b* serving as the first alignment mark in the alignment area E2.

As shown in FIG. 8*b*, the pillar-shaped mask pillar (mask member) M is formed in the alignment area E2. The mask pillar M will be used for forming the opening 112A communicating with the alignment mark 111*b* in the gate insulating film 112 that will be described later. In this example, by exposing the alignment mark 111*b* through the opening 112A, the pattern of the alignment mark 111*b* appears on the surface of a gate wiring film 113 formed on the gate insulating film 112. This makes it possible to align the gate wiring 113*a* with the first semiconductor film 111*a*, which is underlying.

The mask pillar M is formed by selectively dropping a liquid organic material, such as a resist, on the alignment mark 111*b* or a region including the alignment mark 111*b* by using a droplet delivery device, such as an inkjet device, and then solidifying the material. The thickness (height) of the mask pillar M is set equal to or more than the thickness of the gate insulating film 112 formed afterward. This prevents the mask pillar M from getting buried in the gate insulating film 112. In order to prevent the dropped liquid material from spreading over the region for forming the alignment mark 111*b* in this step, a region around the alignment mark 111*b* on the substrate may be provided with liquid repellency in advance. Liquid repellency is available, for example, by forming a liquid repellent film of fluororesin or the like around the opening.

As shown in FIG. 8*c*, the gate insulating film 112 composed of silicon oxide etc. can be deposited around the mask pillar M, that is, on the whole surface of the substrate except for the mask pillar M, by liquid-phase processing. First, an embrocation containing xylene mixed with polysilazane (a liquid material containing polysilazane) is spin-coated on the substrate. Then, prebaking is performed at 100 to 150 degrees Celsius for five minutes. Here, in order to prevent the liquid material from attaching to the upper part of the mask pillar M, it is preferable to provide the mask pillar M with liquid repellency before applying the liquid material. Thus the gate insulating film 112 is provided.

As shown in FIG. 8*d*, the mask pillar M is removed with a separating liquid (e.g. hot concentrated sulfuric acid). Thus, the opening 112A is formed in the gate insulating film 112. The alignment mark 111*b* is exposed through the opening 112A. Subsequently, polysilazane contained in the gate insulating film 112 is burned.

As shown in FIG. 8*e*, the gate wiring film 113 made of adequate metal (e.g., tantalum, aluminum, titanium), metal nitride, polysilicon, or other materials is thickly formed on the gate insulating film 112. The gate wiring film 113 that is opaque is provided on the whole surface of the substrate in this step. Since the gate insulating film 112 has the opening 112A through which the first alignment mark 111*b* is exposed as mentioned above, the concave-convex part 113A reflecting the pattern of the first alignment mark 111*b* is created on the surface of the gate wiring film 113 as well.

Next, as shown in FIG. 8*f* the gate wiring film 113 is patterned so as to form the gate wiring 113*a* including a gate electrode in the element area E1 and the second alignment mark 113*b* having the concave-convex part 113A in the alignment area E2. Since the surface of the gate wiring film 113 has a concave-convex pattern (the concave-convex part 113A) reflecting the pattern of the alignment mark 111*b*, which is underlying, in this example as mentioned above, it is possible to pattern the gate wiring film 113 with high accuracy of alignment with the semiconductor film 111*a*, which is underlying, by using the concave-convex part 113A as an alignment mark.

Impurity ions are doped in the semiconductor film 111*a* by using the gate wiring 113*a* as a mask, and thereby forming the source region 111*s* and the drain region 111*d*. Subsequently, the interlayer insulating film 114 is deposited on the whole surface of the substrate so as to cover the gate insulating film 112, the gate wiring 113*a*, and the second alignment mark 113*b*. The contact hole H11 is formed in a position corresponding to a source region of the interlayer insulating film 114 and the gate insulating film 112. The contact hole H12 is formed in a position corresponding to a drain region of the interlayer insulating film 114 and the gate insulating film 112.

A metal film of aluminum, chromium, tantalum, or the like can be deposited by sputtering, PVD, or other methods so as to cover the inner wall of the contact holes H11 and H12. Then the metal film is patterned to form the source wiring 115*a* including a source electrode and the drain wiring 115*b* including a drain electrode. In this step, the metal film that is opaque is provided on the whole surface of the substrate. Since the interlayer insulating film 114 has the contact holes H11 and H12, the concave-convex part 115A reflecting the concave-convex patterns of the contact holes H11 and H12 can be formed on the surface of the metal film. Accordingly, by using the concave-convex part 115A appearing on the surface of the metal film as an alignment mark, it is possible to pattern the metal film with high accuracy of alignment with the semiconductor film 11*a* and the gate wiring 113*a*, which are underlying. FIG. 8*g* shows wirings such as the source wiring 115*a* and the drain wiring 115*b* being provided. Subsequently, on the source electrode 115*a* and the drain electrode 115*b*, a protective film can be provided by depositing silicon oxide, silicon nitride, PSG, or the like if necessary. A thin-film transistor 4 is thus manufactured through the above-mentioned steps.

According to the method for manufacturing a TFT of the exemplary embodiment that has been described, the pattern of the alignment mark appears on films formed after forming the insulating films by liquid-phase processing. Therefore, the films formed after forming the insulating films can be patterned with high accuracy of alignment with an underlying semiconductor film, wiring layer, etc.

Figure 9:
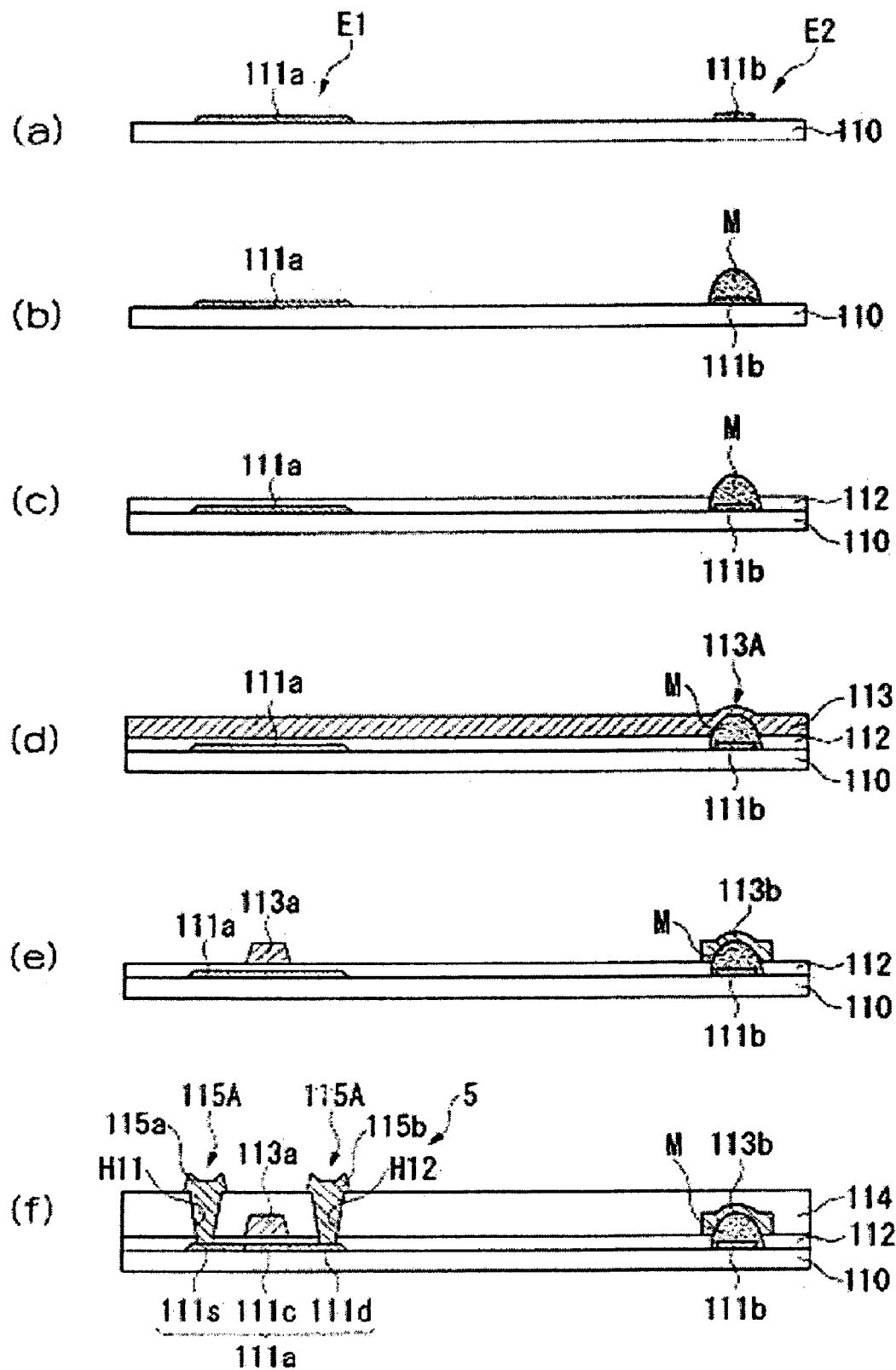
FIG. 9 is a process drawing illustrating a method for manufacturing a thin-film transistor of a sixth exemplary embodiment of the invention.

Referring now to FIG. 9, a sixth exemplary embodiment of the invention will be described. FIG. 9 is a process drawing illustrating a method for manufacturing a TFT according to the present embodiment. The drawing is a sectional view schematically showing the TFT forming region (element area) E1 and the alignment mark forming region (alignment area) E2 in a magnified form. In this embodiment, the same members and elements as those in the third or fourth embodiment will be given the same reference numerals, and further description thereof will be omitted.

On the substrate 110, a semiconductor film made of amorphous silicon or the like is formed. Then the semiconductor film is crystallized by laser annealing, for example, and patterned by etching, for example. As shown in FIG. 9*a*, this process forms the amorphous semiconductor film (first semiconductor film) 111*a* having a predetermined shape in the element area E1, and also forms the second semiconductor film 111b serving as the first alignment mark in the alignment area E2.

As shown in FIG. 9b, the pillar-shaped mask pillar (mask member) M is formed in the alignment area E2. The mask pillar M will be used for providing the surface of the gate wiring film 113, which will be described below, with a concave-convex pattern (i.e. the concave-convex part 113A) reflecting the pattern of the alignment mark 111b. In other words, the pattern of the alignment mark 111b appears on the surface of the gate wiring film 113. In this example, the gate wiring film 113 is patterned by using the concave-convex part 113A, and thereby the gate wiring 113a can be aligned with the semiconductor film 111a, which is underlying, with high accuracy.

The mask pillar M is formed by selectively dropping a liquid material containing a mask-member material on the alignment mark 111b or a region including the alignment mark 111b by using a droplet delivery device, such as an inkjet device, and then solidifying the material. The thickness (height) of the mask pillar M is set equal to or more than the thickness of the gate insulating film 112 formed afterward. In other words, the mask pillar is set high enough to remain above the level of planarization by the gate insulating film 112 formed by liquid-phase processing. This prevents the concave-convex pattern reflecting the mask pillar M from getting buried in the gate insulating film 112. More specifically, a portion of the gate insulating film 12 having the mask pillar M may have an arched top sticking out from a surrounding area, or the upper part of the mask pillar M may project from the surface of the gate insulating film 112. Unlike the first and second exemplary embodiments, the mask pillar M is not removed and remains on the substrate after forming the gate insulating film in this example. Therefore, the material of the mask pillar M is preferably a highly heat resistant material, for example, an inorganic material composed of a liquid material containing polysilazane or metal micro-particles, so that the mask pillar M will be resistant to heat while burning the gate insulating film 112 and the interlayer insulating film 114.

As shown in FIG. 9c, the gate insulating film 112 composed of silicon oxide etc. is deposited around the mask pillar M, that is, on the whole surface of the substrate except for the mask pillar M, by liquid-phase processing. First, an embrocation containing xylene mixed with polysilazane (a liquid material containing polysilazane) is spin-coated on the substrate. Then, prebaking is performed at 100 to 150 degrees Celsius for five minutes. Here, in order to prevent the liquid material from attaching to the upper part of the mask pillar M, it is preferable to provide the mask pillar M with liquid repellency before applying the liquid material.

After completing the prebaking process, heat treatment is performed at 300 to 400 degrees Celsius in a wet $O_2$ atmosphere for 60 minutes (step of burning polysilazane). Thus the gate insulating film 112 made of silicon oxide is provided.

As shown in FIG. 9d, the gate wiring film 113 made of adequate metal (e.g. tantalum, aluminum, titanium), metal nitride, polysilicon, or other materials is thickly formed on the gate insulating film 112 and the mask pillar M. The gate wiring film 113 that is opaque is provided on the whole surface of the substrate in this step. Since the surface of the gate insulating film 112 has the concave-convex pattern reflecting the mask pillar M and the first alignment mark 111b in combination, the concave-convex part 113A reflecting this concave-convex pattern is created on the surface of the gate wiring film 113 as well.

Next, as shown in FIG. 9e, the gate wiring film 113 is patterned so as to form the gate wiring 113a including a gate electrode in the element area E1 and the second alignment mark 113b having the concave-convex part 113A in the alignment area E2. Since the surface of the gate wiring film 113 has the concave-convex pattern (i.e., the concave-convex part 113A) reflecting the pattern of the alignment mark 111b, which is underlying, in this example as mentioned above, it is possible to pattern the gate wiring film 113 with high accuracy of alignment with the semiconductor film 111a, which is underlying, by using the concave-convex part 113A as an alignment mark.

Impurity ions are doped in the semiconductor film 111a by using the gate wiring 113a as a mask, and thereby forming the source region 111s and the drain region 111d. Subsequently, the interlayer insulating film 114 is deposited on the whole surface of the substrate so as to cover the gate insulating film 112, the gate wiring 113a, and the second alignment mark 113b. The contact hole H11 is formed in a position corresponding to a source region of the interlayer insulating film 114 and the gate insulating film 112. The contact hole H12 is formed in a position corresponding to a drain region of the interlayer insulating film 114 and the gate insulating film 112.

A metal film of aluminum, chromium, tantalum, or the like is deposited by sputtering, PVD, or other methods so as to cover the inner wall of the contact holes H11 and H12. In this step, the metal film that is opaque is provided on the whole surface of the substrate. Since the interlayer insulating film 114 has the contact holes H11 and H12, the concave-convex part 115A reflecting the concave-convex patterns of the contact holes H 11 and H12 is formed on the surface of the metal film.

Next, the metal film is patterned so as to form the source wiring 115a including a source electrode and the drain wiring 115b including a drain electrode as shown in FIG. 9f. Since the surface of the metal film has the concave-convex part 115A reflecting the concave-convex patterns of the contact holes H11 and H12, which are underlying, in this example as mentioned above, it is possible to pattern the metal film with high accuracy of alignment with the semiconductor film 111a and the gate wiring 113a, which are underlying, by using the concave-convex part 115A as an alignment mark.

Subsequently, on the source electrode 115a and the drain electrode 115b, a protective film can be provided by depositing silicon oxide, silicon nitride, PSG, or the like if necessary. A thin-film transistor 5 is thus manufactured through the above-mentioned steps.

According to the method for manufacturing a TFT of the exemplary embodiment that has been described, the pattern of the alignment mark appears on films formed after forming the insulating films by liquid-phase processing. Therefore, the films formed after forming the insulating films can be patterned with high accuracy of alignment with an underlying semiconductor film, wiring layer, etc.

In this example, the mask pillar M for providing the surface of the gate wiring film 113 with a concave-convex pattern is added on the alignment mark 111b. However, the position for forming the mask pillar M is not limited to a planar area of the alignment mark 111b. The mask pillar M can be placed in a different position as long as the relative position between the mask pillar and the alignment mark is controlled. In other words, if the mask pillar M is provided at least in alignment with the alignment mark 111b, the above-mentioned effects can be achieved.

Figure 10:
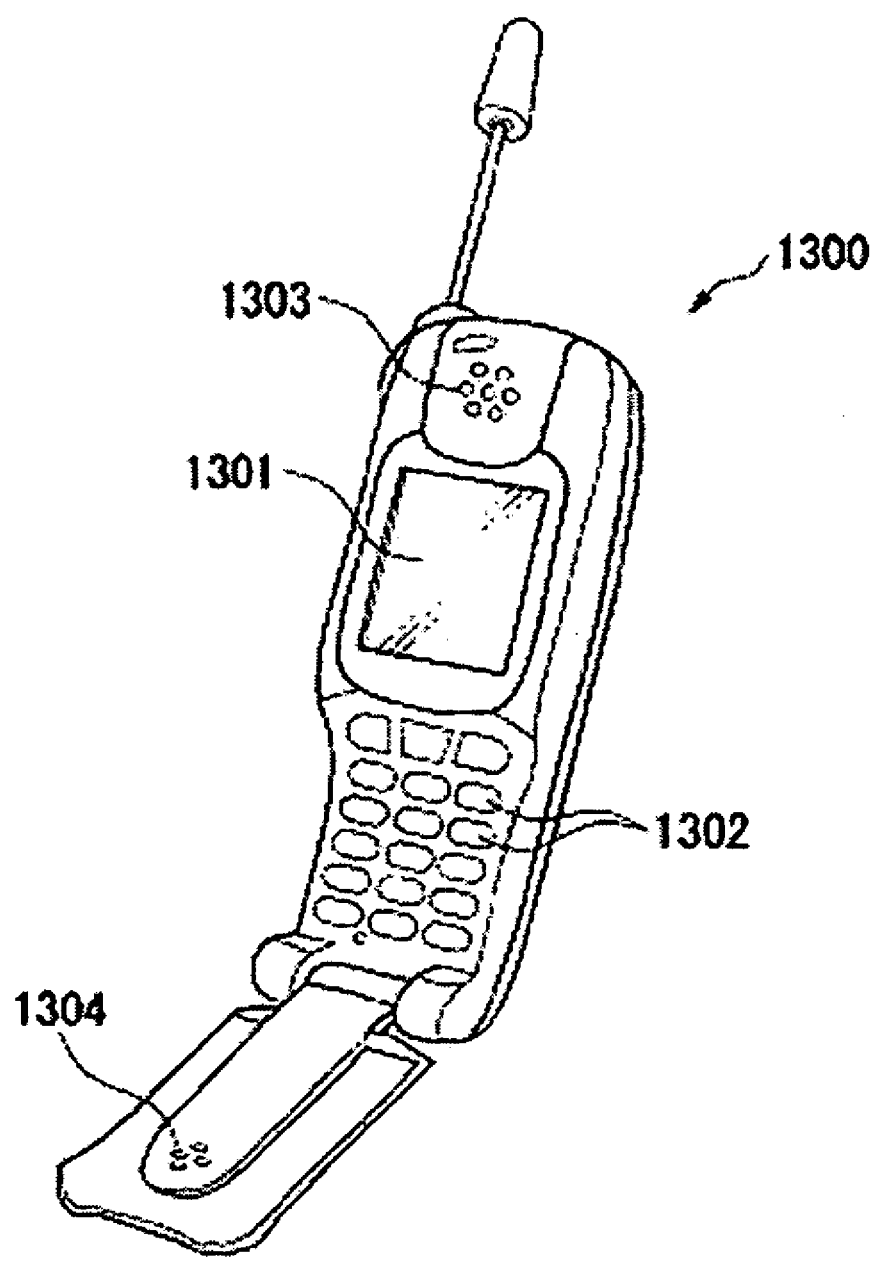
FIG. 10 is a perspective view showing an example of electronic equipment according to the invention.

Electronic equipment according to the embodiment will now be described. FIG. 10 is a perspective view showing an example of electronic equipment according to the embodiment. A cellular phone 1300 shown in this diagram includes a semiconductor device manufactured by one of the above-mentioned methods inside its case or in its display part 1301. The drawing also shows operation buttons 1302, an earpiece 1303, and a mouthpiece 1304.

It should be understood that the semiconductor device according to any of the above-mentioned exemplary embodiments can be applied not only to cellular phones, but also to electronic books, personal computers, digital still cameras, liquid crystal televisions, video tape recorders of viewfinder types or monitor viewing types, car navigation devices, pagers, electronic notebooks, electric calculators, word processors, work stations, picture phones, point-of-sale (POS) terminals, apparatuses equipped with a touch panel, and the like. The semiconductor device according to the invention provides any of the above-mentioned electronic equipment with higher performance.

While the preferred embodiments according to the present embodiment have been described referring to the accompanying drawings, it is understood that the invention is not limited to these examples.

For example, while the alignment mark 10*a* is provided on the substrate 10 in advance in the first and second embodiments, the alignment mark 10*a* may be formed at the same time as the semiconductor film 11*a*, which is formed firstly, on the substrate. In other words, the semiconductor film 11*a*, which is formed firstly, is aligned based on the mechanical precision of a patterning device, and films formed afterward are aligned by using the alignment mark 10*a* formed at the same time as the semiconductor film 11*a*. Conversely, while the alignment mark 111*b* is formed at the same time as the semiconductor film 11*a*, which is formed firstly, on the substrate in the third through sixth embodiments, the alignment mark 111*b* may be provided on the substrate 110 in advance before forming the semiconductor film.

The order of each of the steps in the above-mentioned embodiments is not limited to the described orders. The order of the steps may be adequately changed. For example, the step of isolation may follow the forming of the gate insulating film 12 or 112. The forming of the gate wiring film 13 or 113 may follow the step of doping an impurity using a resist mask or other metal masks.

While the semiconductor films 11*a* and 111*a* are made by being transformed into a polycrystalline film in the above-mentioned embodiments, an amorphous semiconductor film (amorphous silicon film) can also be used as an active layer of a transistor. Also, while both the gate insulating film 12 or 112 and the interlayer insulating film 14 or 114 are made into polysilazane burned films in the present embodiment, either of the insulating films may be a film other than a polysilazane burned film (e.g. a CVD or PVD film). Also in the present embodiment, insulating films such as the gate insulating films 12 and 112, the interlayer insulating films 14 and 114, and conductive films such as the gate wiring film 115*a* and the drain wiring film 115*b* are given as examples of functional films according to the present embodiment, but they are not intended to limit the types of such functional films. The present embodiment is also applicable to forming of other functional films by liquid-phase processing. Furthermore, while spin coating or droplet delivery is used for forming such films in the above-mentioned embodiments, other known film-forming methods, such as slit coating, dip coating, spray coating, and printing can also be used for forming the functional films.

Moreover, while the above-mentioned embodiments show examples in which the methods for manufacturing a semiconductor device according to the present embodiment are applied to manufacturing of top-gate transistors, applications of the present embodiment are not limited to them. The present embodiment can also be applied to manufacturing of bottom-gate transistors and manufacturing of semiconductor devices other than transistors.

Furthermore, the shapes, combinations, and the like of each component member described in the above-mentioned examples are presented by way of example. Various modifications can be made in accordance with design requirements or the like, without departing from the spirit and scope of the invention.

What is claimed is:

1. An alignment method in a device manufacturing process, comprising
    forming an alignment mark film over a substrate;
    forming a functional film over the substrate;
    forming a film over the functional film, a portion of the film overlapping with the alignment mark film, and the portion having a shape corresponding to the alignment mark film; and
    patterning the film by using the portion as an alignment mark.

2. The alignment method according to claim 1, the alignment mark film including a first alignment mark film and a second alignment mark film, the forming an alignment mark film including forming the first alignment mark film over the substrate and forming the second alignment mark film on the first alignment mark film.

3. The alignment method according to claim 1, the alignment mark film being formed by dropping a liquid material that includes the alignment mark film forming material.

4. The alignment method according to claim 1, the functional film being formed by liquid-phase processing.

5. The alignment method according to claim 1, the alignment mark film being high enough to remain above a level of planarization by the functional film between the substrate and the functional film.

6. An alignment method in a device manufacturing process, comprising:
    forming a first alignment mark film over a substrate;
    forming a functional film over the substrate, the functional film being transmissive;
    forming a second alignment mark film over the functional film by using the first alignment mark film as a first alignment mark;
    forming a film over the functional film, a portion of the film overlapping with the second alignment mark film, and the portion having a shape corresponding to the second alignment mark film; and
    patterning the film by using the portion as a second alignment mark.

7. The alignment method according to claim 6, a relative position of the second alignment mark film being determined by a position of the first alignment mark film.

8. The alignment method according to claim 7, the second alignment mark film overlapping with the first alignment mark film.

9. An alignment method in a device manufacturing process, comprising:
    forming a liquid repellent region over a substrate;

forming a functional film over the substrate by depositing a liquid material, the functional film being formed over the substrate excluding the liquid repellent region;

forming a film over the functional film, a portion of the film overlapping with the liquid repellent region, and the portion having a shape corresponding to the liquid repellent region; and patterning the film by using the portion as alignment mark.

10. An alignment method in a device manufacturing process, comprising:

forming an alignment mark film over a substrate;

forming a functional film over the substrate, the functional film overlapping with the alignment mark film, the functional film being transmissive;

selectively removing a part of the functional film that overlaps with the alignment mark film;

forming a film over the functional film, a portion of the film overlapping with the alignment mark film, and the portion having a shape corresponding to the second alignment mark film; and patterning the film by using the portion as an alignment mark.

11. A malignment method in a device manufacturing process, comprising:

forming a functional film over a substrate by selectively dropping a liquid material except for a part of the substrate;

forming a film over the functional film, a portion of the film overlapping with the part of the substrate, and the portion having a shape corresponding to the part of the substrate; and patterning the film by using the portion as an alignment mark.

12. A method of manufacturing a semiconductor device, comprising:

using the alignment method according to claim 1.

13. A method of manufacturing a semiconductor device, comprising:

forming a semiconductor film over a substrate:

patterning the semiconductor film so as to form a first semiconductor film and a second semiconductor film, the second semiconductor film being adopted to use for alignment;

forming an alignment mark film corresponding to the second semiconductor film;

forming an insulating film over the substrate, the insulating film not covering the alignment mark film;

forming a film over the insulating film, a portion of the film overlapping with the alignment mark film, and the portion having a shape corresponding to the alignment mark film; and patterning the film by using the portion as an alignment mark.

14. The alignment method according to claim 13, the alignment mark film being formed by dropping a liquid material that includes the alignment mark film forming the material.

15. A method of manufacturing a semiconductor device, comprising:

forming a semiconductor film over a substrate;

patterning the semiconductor film so as to form a first semiconductor film and a second semiconductor film, the second semiconductor film being adopted to use for alignment;

forming an insulating film over the substrate, the insulating film overlapping with the first semiconductor film, the insulating film having an opening that overlaps with the second semiconductor film;

forming a film over the substrate, a portion of the film overlapping with the opening, and the portion having a shape corresponding to the opening; and patterning the film by using the portion as an alignment mark.

16. A method of manufacturing a semiconductor device, comprising:

forming a semiconductor film over a substrate;

patterning the semiconductor film to form a first semiconductor film and a second semiconductor film, the second semiconductor film being adopted to use for alignment;

forming an alignment mark film corresponding to the second semiconductor film;

forming an insulating film over the substrate, the insulating film not covering the alignment mark film;

removing the alignment mark film to form an opening in the insulating film;

forming a film over the insulating film, a portion of the film overlapping with the opening, and the portion having a shape corresponding to the opening; and patterning the film by using the portion as an alignment mark.

17. A method of manufacturing a semiconductor device, comprising:

forming a mask member over a substrate;

forming a functional film over the substrate by liquid-phase processing, the functional film being formed over a whole surface of the substrate except for the mask member; and patterning the functional film by using a portion over the substrate, the portion overlapping with the mask member as an alignment mark.

* * * * *